(12) United States Patent
Iwaki et al.

(10) Patent No.: US 7,952,257 B2
(45) Date of Patent: May 31, 2011

(54) PIEZOELECTRIC THIN-FILM RESONATOR

(75) Inventors: Masafumi Iwaki, Kawasaki (JP);
Tokihiro Nishihara, Kawasaki (JP);
Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 186 days.

(21) Appl. No.: 12/368,801

(22) Filed: Feb. 10, 2009

(65) Prior Publication Data

US 2009/0206706 A1 Aug. 20, 2009

(30) Foreign Application Priority Data

Feb. 20, 2008 (JP) ................................. 2008-038926

(51) Int. Cl.
*H01L 41/047* (2006.01)
*H03H 9/13* (2006.01)

(52) U.S. Cl. ........ 310/320; 310/321; 310/329; 310/365; 333/187

(58) Field of Classification Search .................. 310/320, 310/321, 329, 365; 333/187
See application file for complete search history.

(56) References Cited

U.S. PATENT DOCUMENTS

| | | | |
|---|---|---|---|
| 6,375,829 B1 * | 4/2002 | Shevchenko et al. ...... | 205/793.5 |
| 6,788,170 B1 | 9/2004 | Kaitila et al. | |
| 6,812,619 B1 | 11/2004 | Kaitila et al. | |
| 7,280,007 B2 * | 10/2007 | Feng et al. ..................... | 333/187 |
| 7,535,154 B2 * | 5/2009 | Umeda et al. ................. | 310/320 |
| 7,649,304 B2 * | 1/2010 | Umeda et al. ................. | 310/320 |
| 2006/0103492 A1 | 5/2006 | Feng et al. | |
| 2006/0226932 A1 | 10/2006 | Fazzio et al. | |
| 2007/0205850 A1 | 9/2007 | Jamneala et al. | |
| 2008/0060181 A1 | 3/2008 | Fazzio et al. | |
| 2010/0148636 A1 * | 6/2010 | Nishihara et al. ............. | 310/365 |

FOREIGN PATENT DOCUMENTS

| | | |
|---|---|---|
| JP | 2003-505906 A | 2/2003 |
| JP | 3735777 B2 | 11/2005 |
| JP | 2006-109472 A | 4/2006 |
| JP | 2006-295924 A | 10/2006 |
| JP | 2007-006501 A | 1/2007 |
| WO | WO 01/06646 A1 | 1/2001 |
| WO | WO 01/06647 A1 | 1/2001 |
| WO | WO-2007052370 A * | 5/2007 |

* cited by examiner

*Primary Examiner* — Thomas M Dougherty

(74) *Attorney, Agent, or Firm* — Arent Fox LLP

(57) ABSTRACT

There is provided a piezoelectric thin-film resonator including a substrate, a lower electrode disposed on the substrate, a piezoelectric film disposed on the lower electrode, an upper electrode disposed on the piezoelectric film in such a manner that a portion of the upper electrode is opposed to the lower electrode, and a mass element disposed on the upper electrode in a portion of an edge of the region of the upper electrode in which the upper electrode and the lower electrode are opposed to each other.

15 Claims, 43 Drawing Sheets

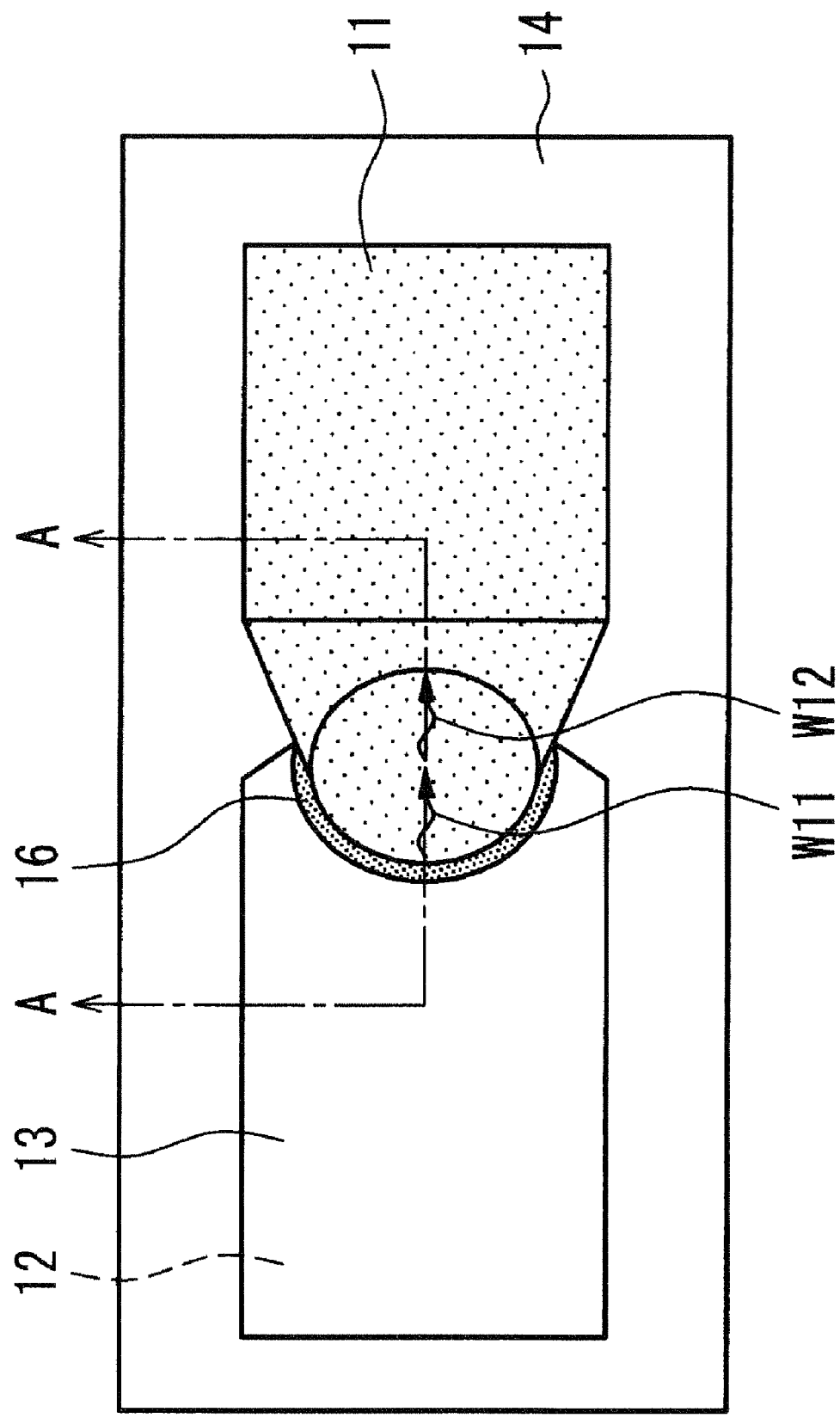

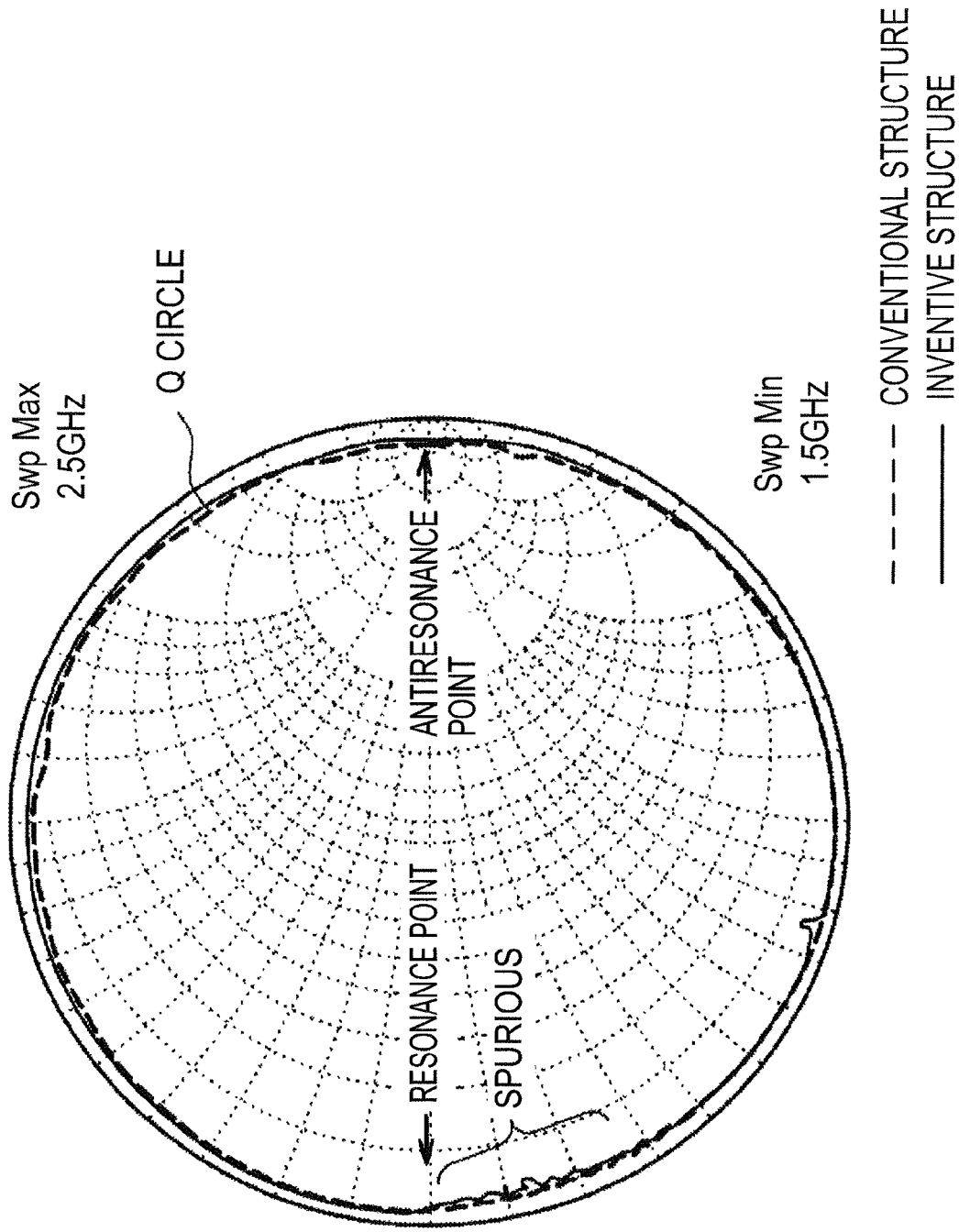

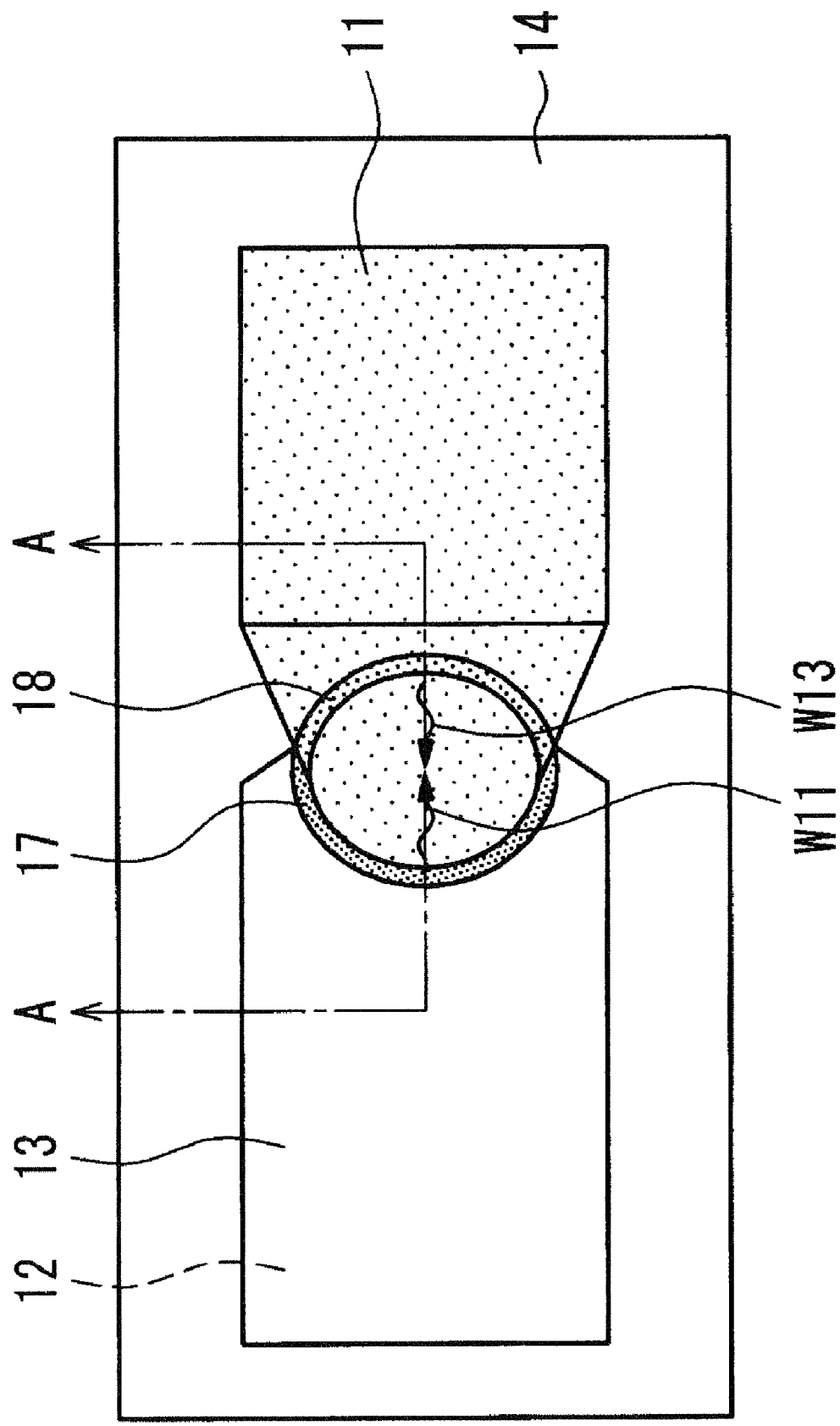

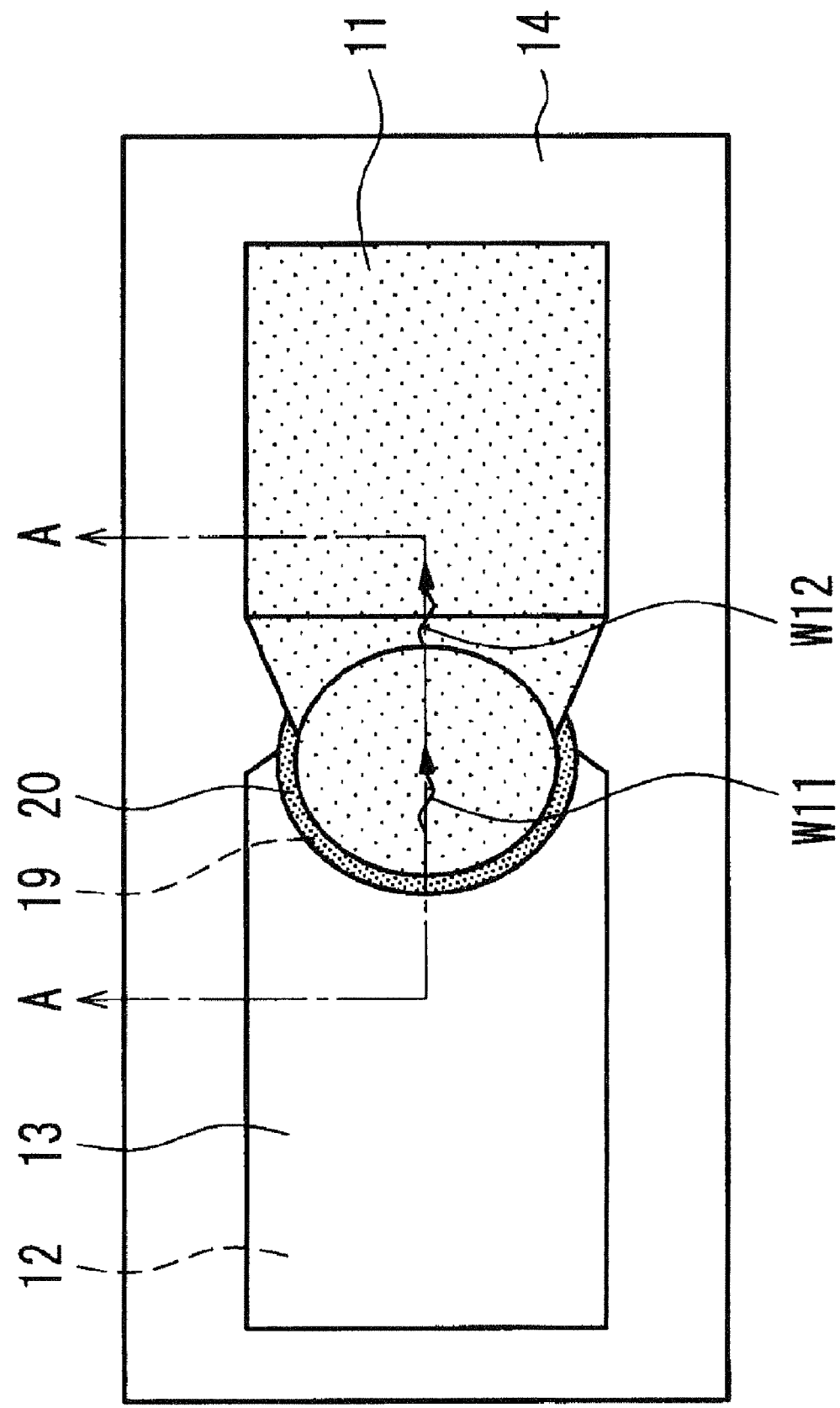

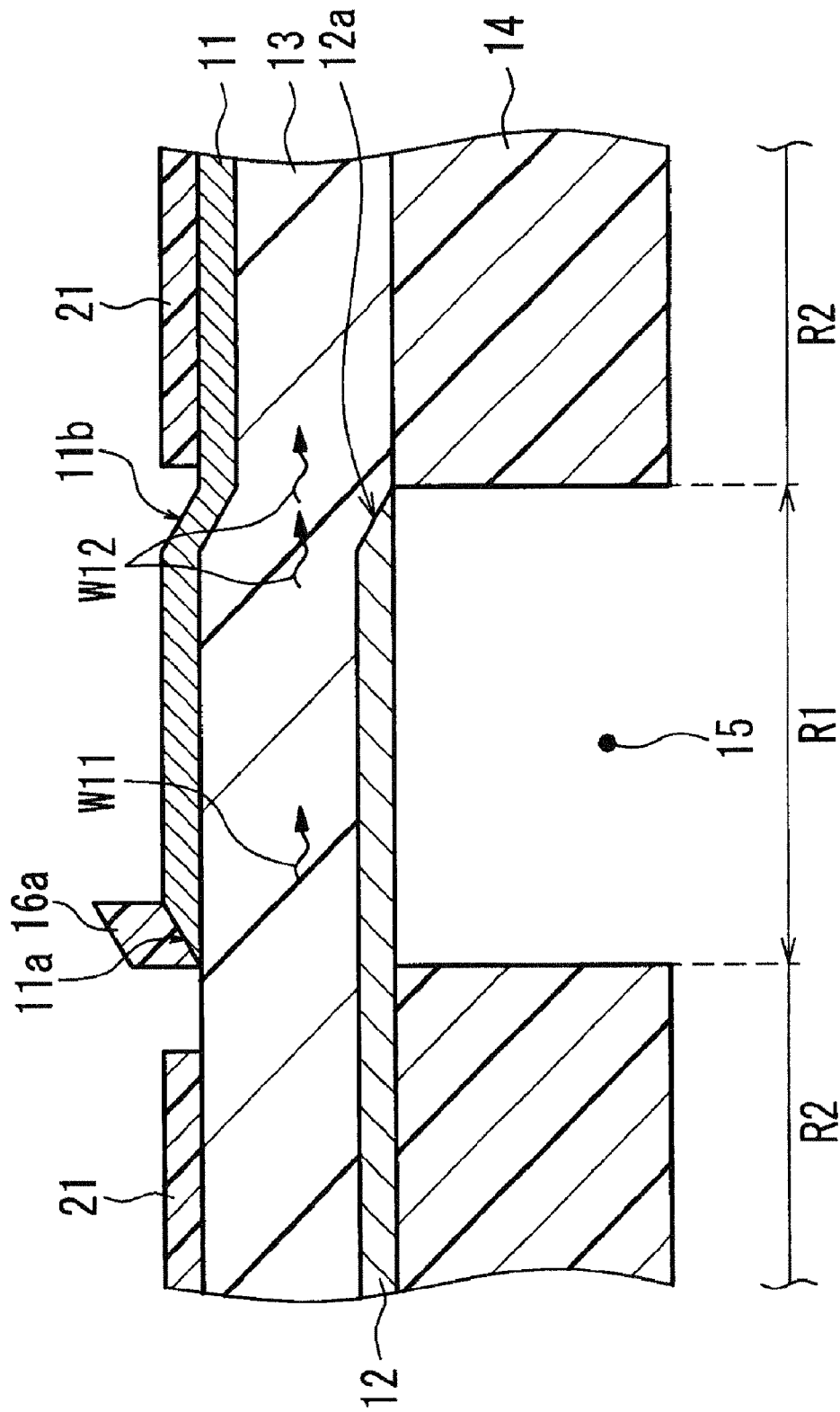

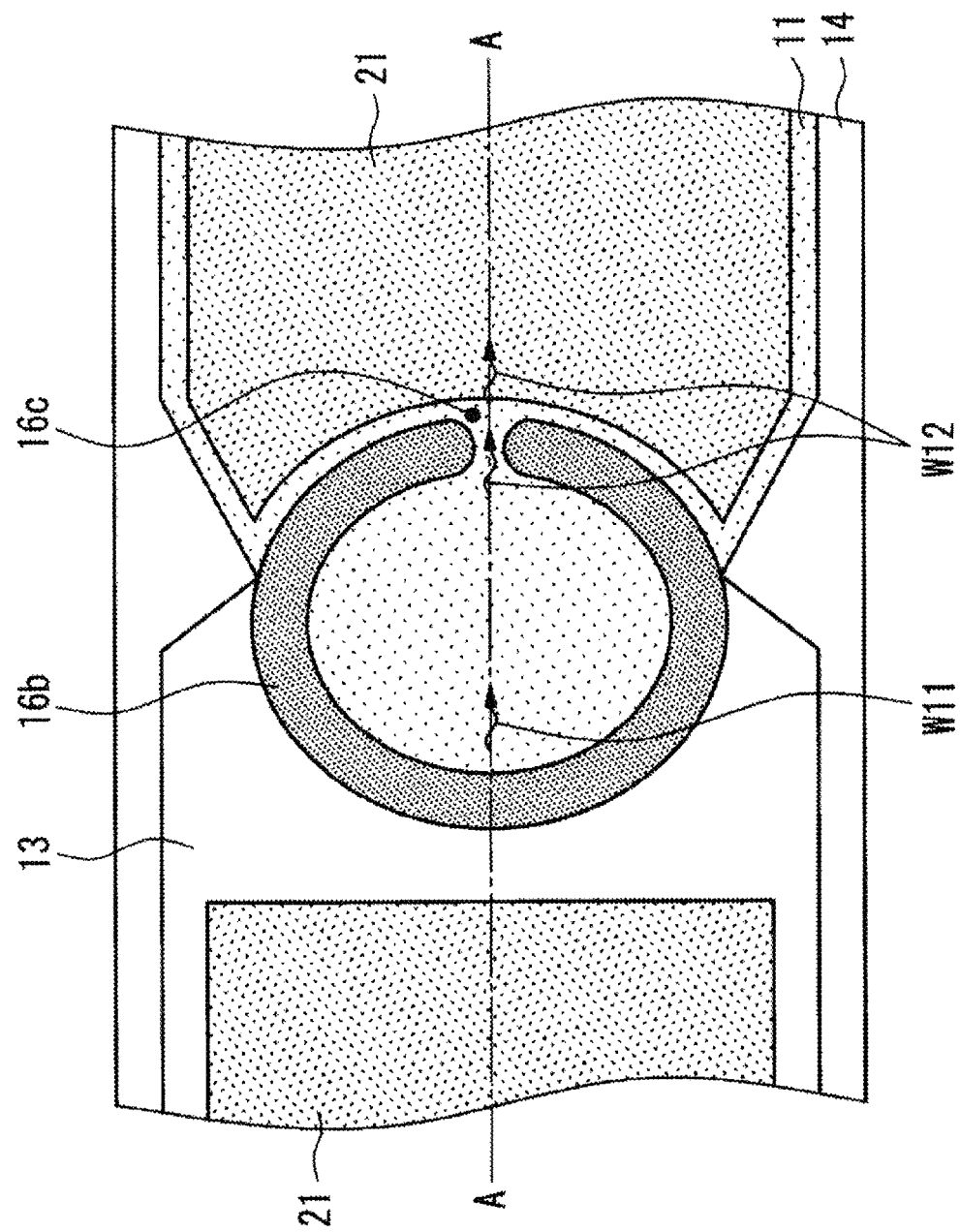

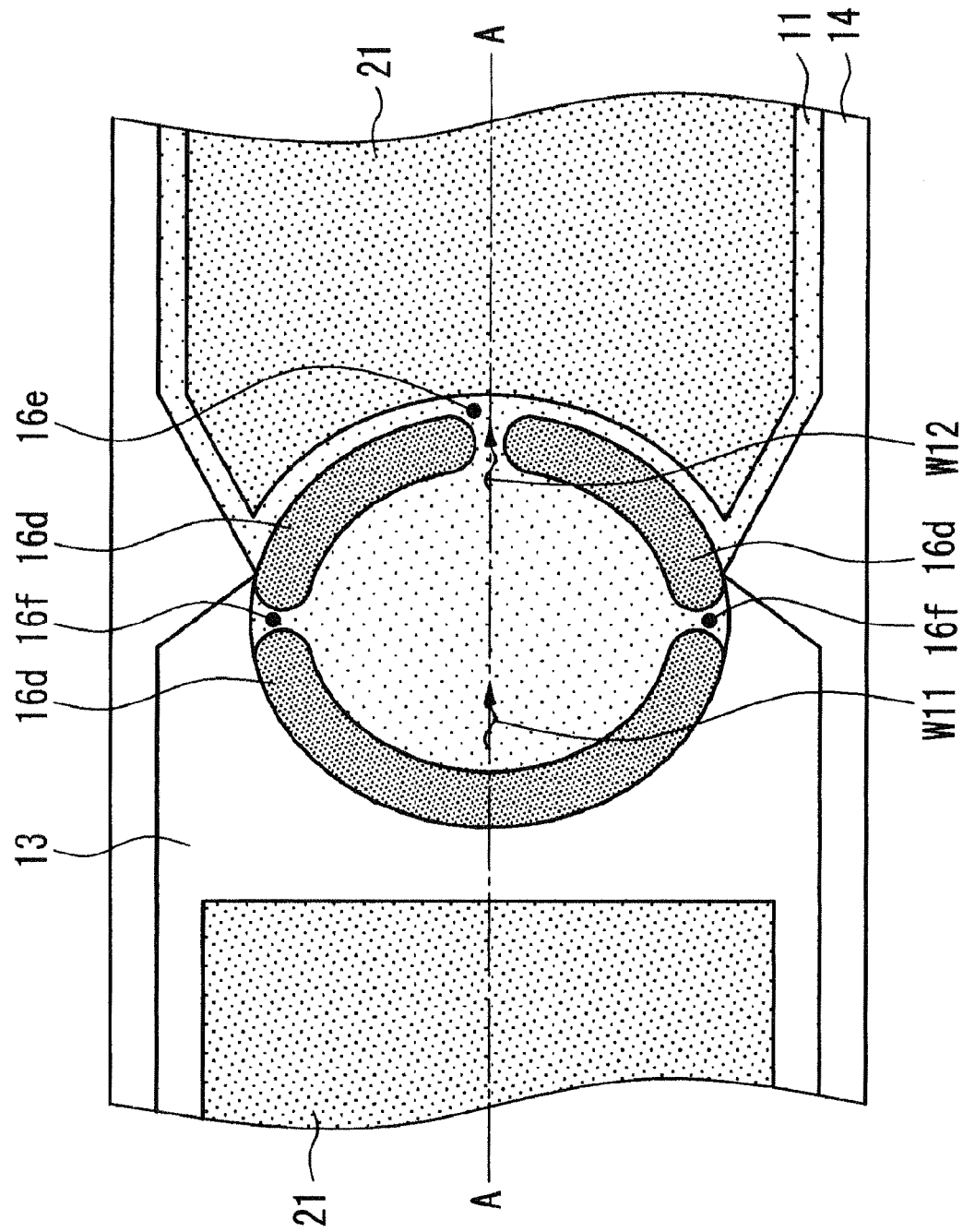

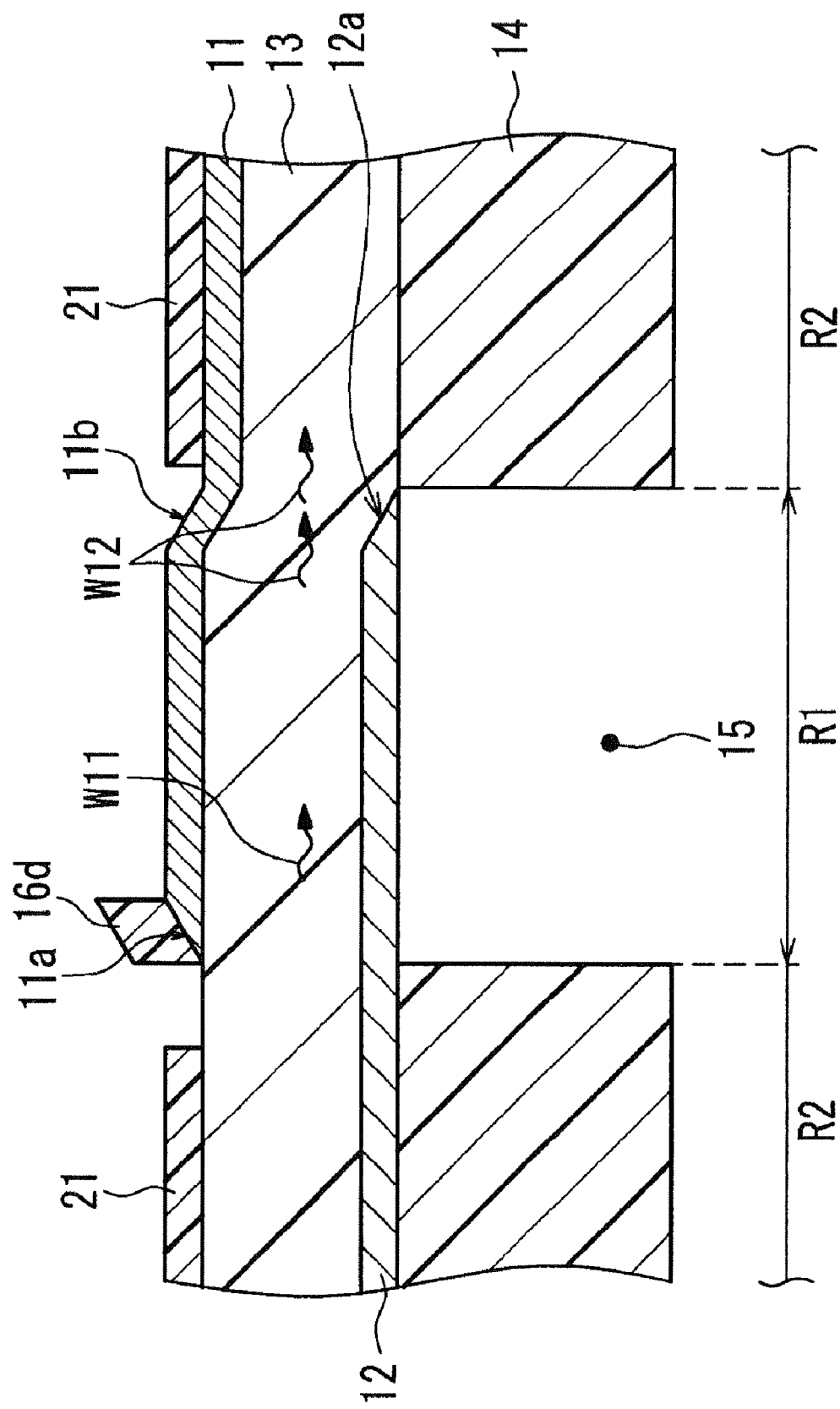

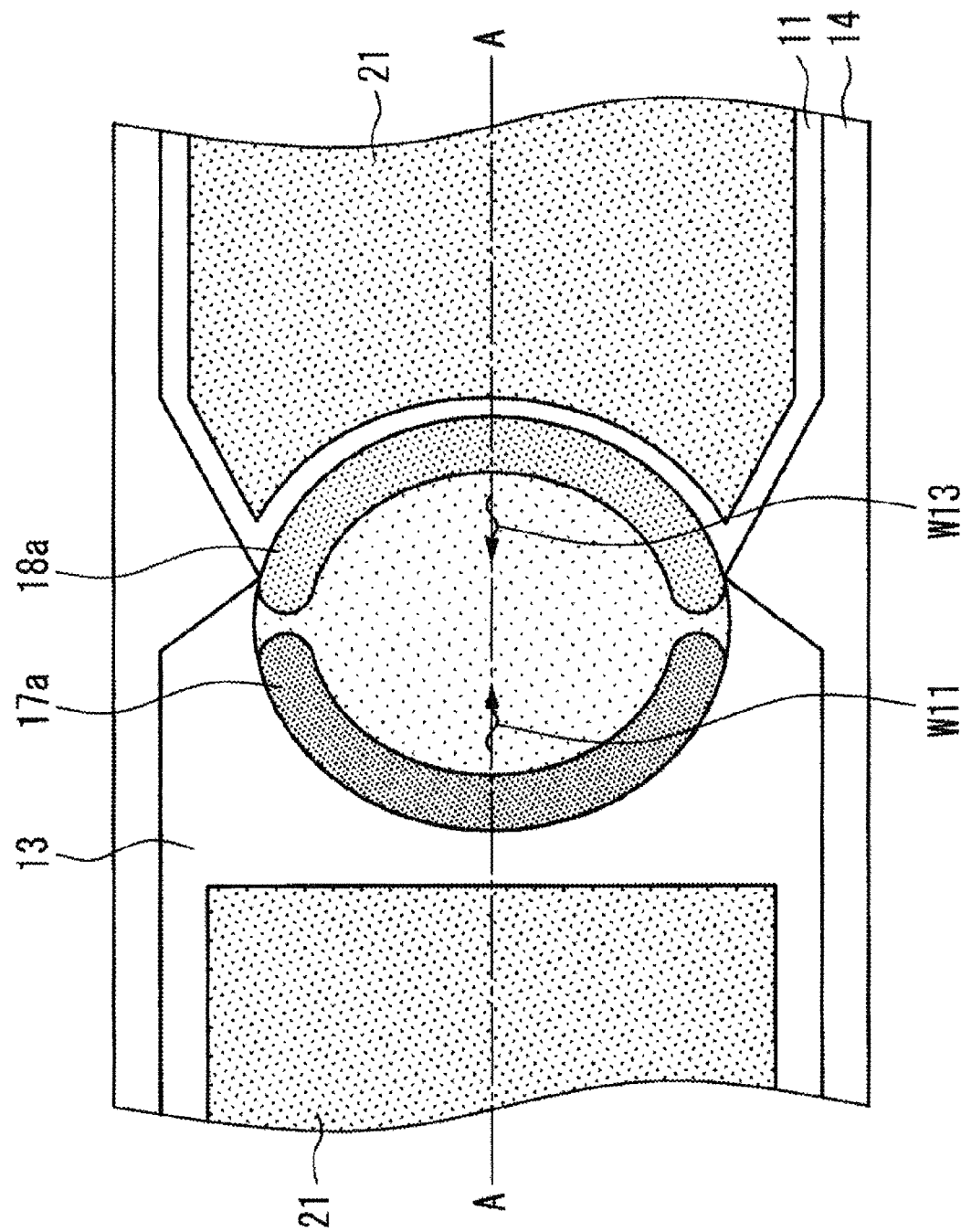

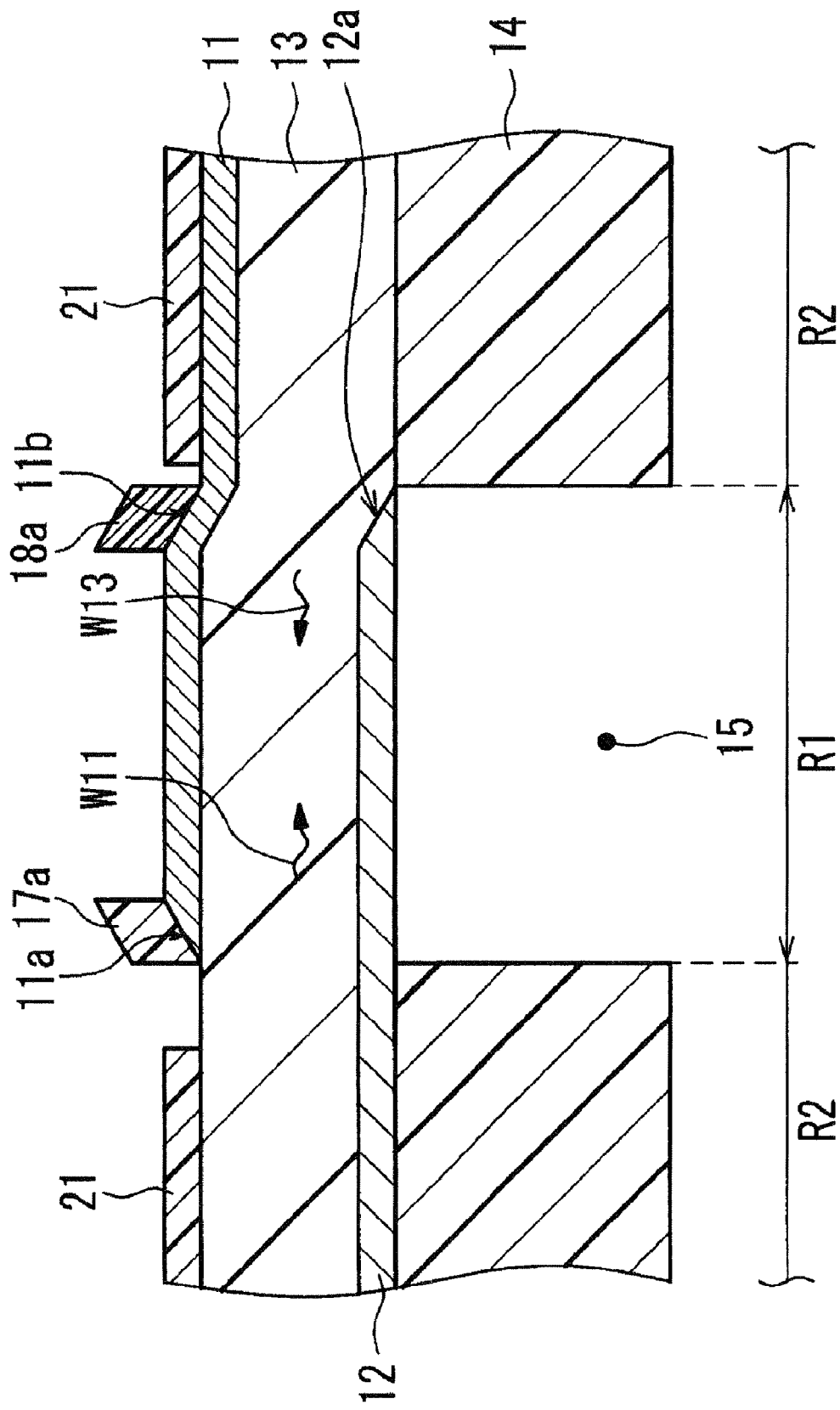

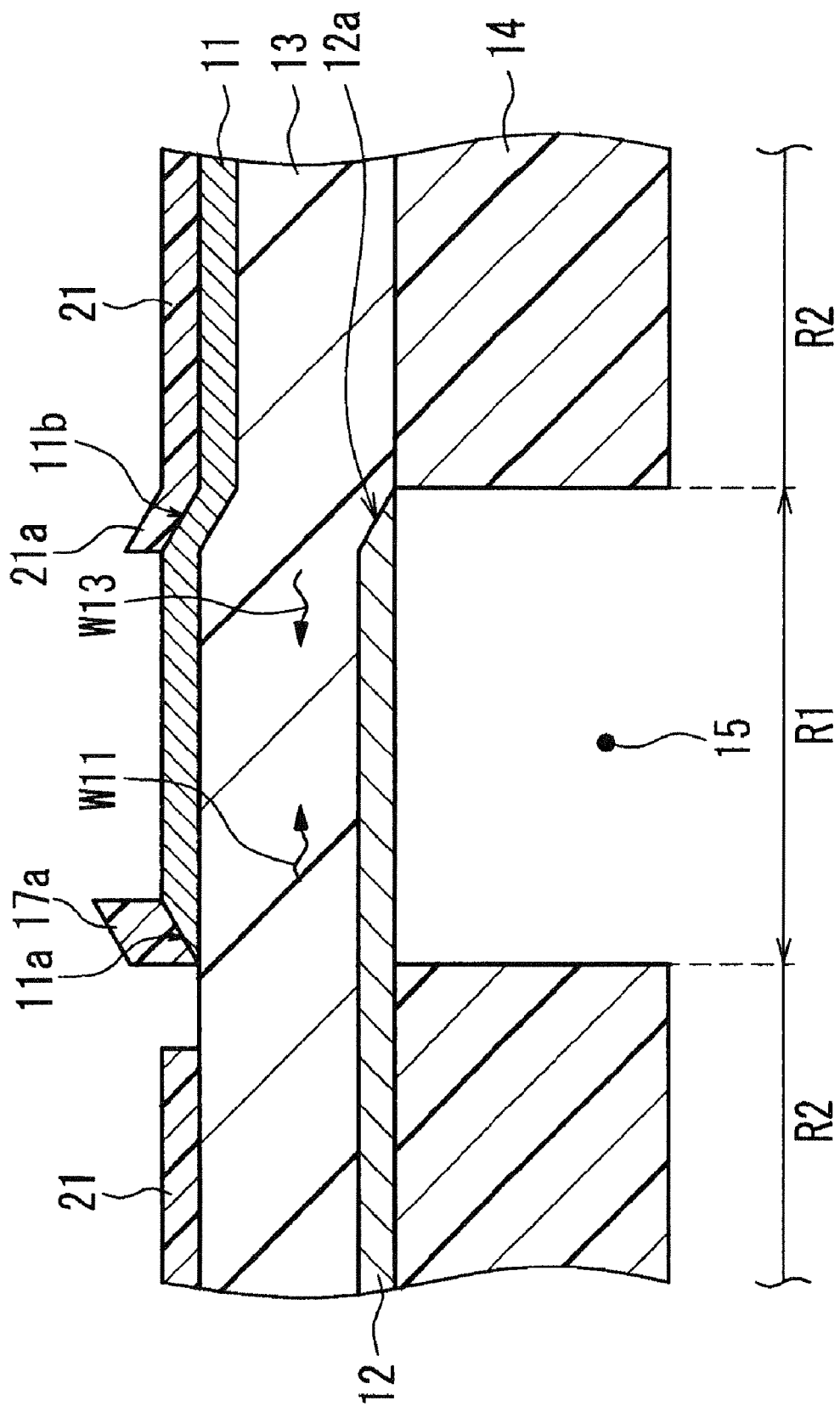

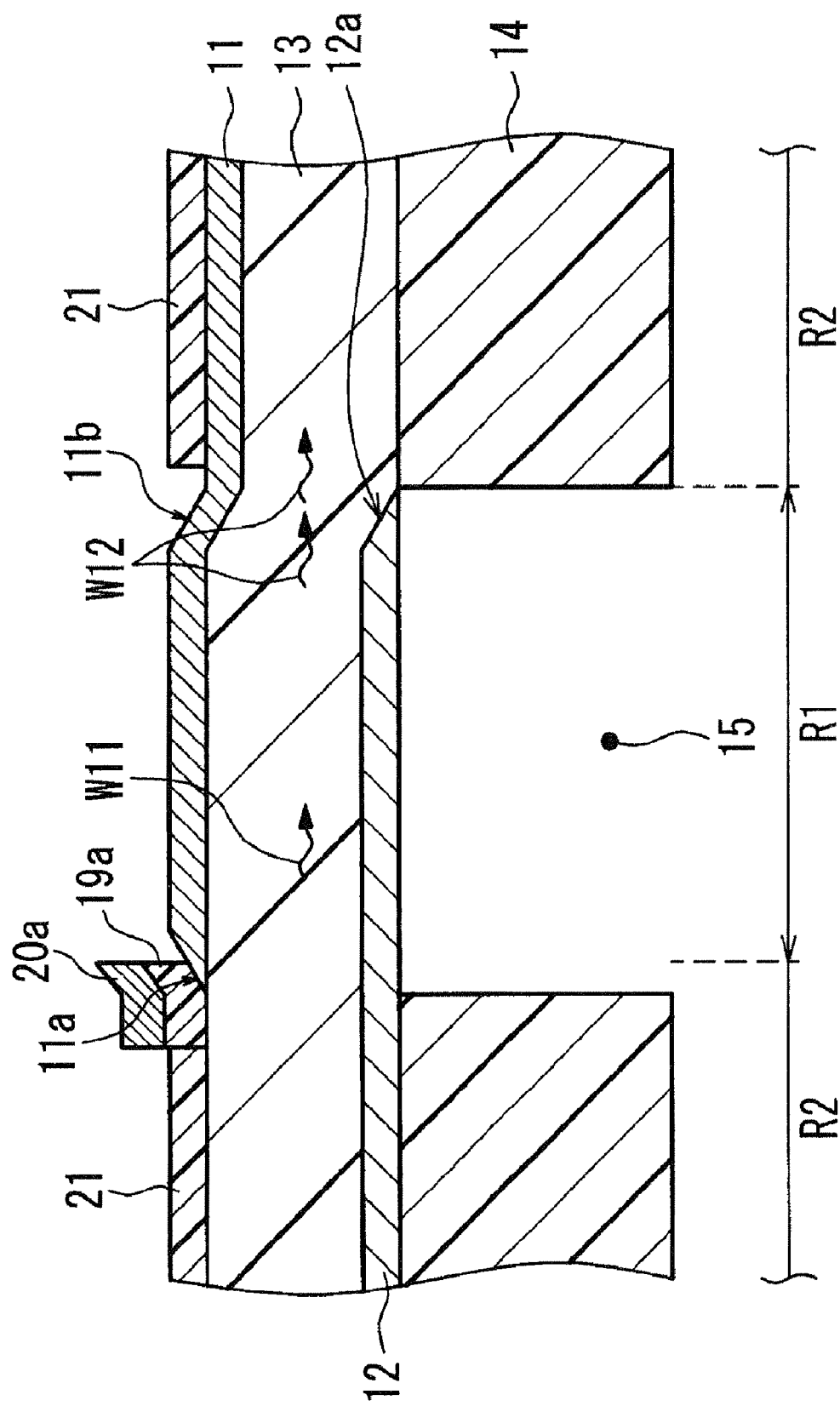

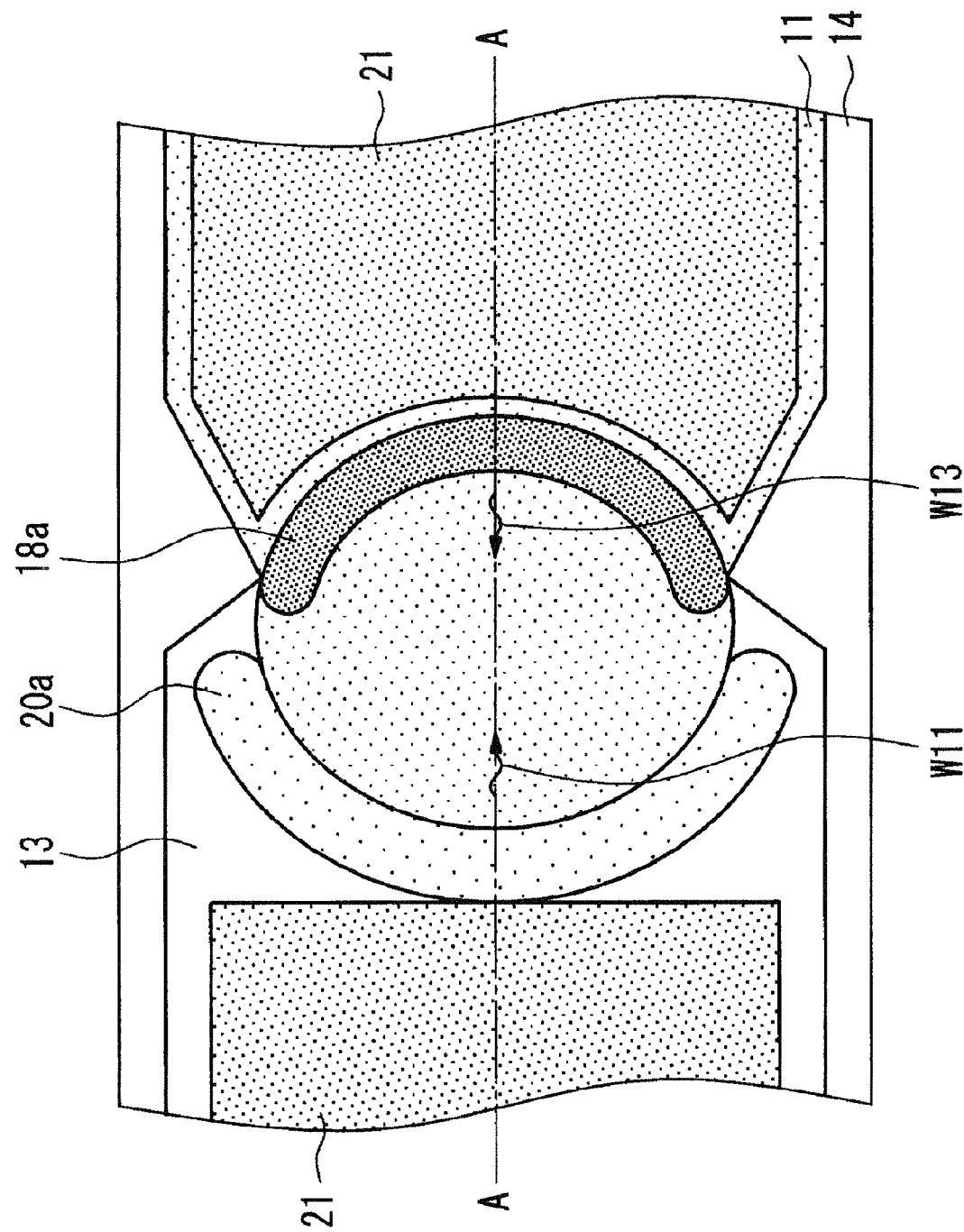

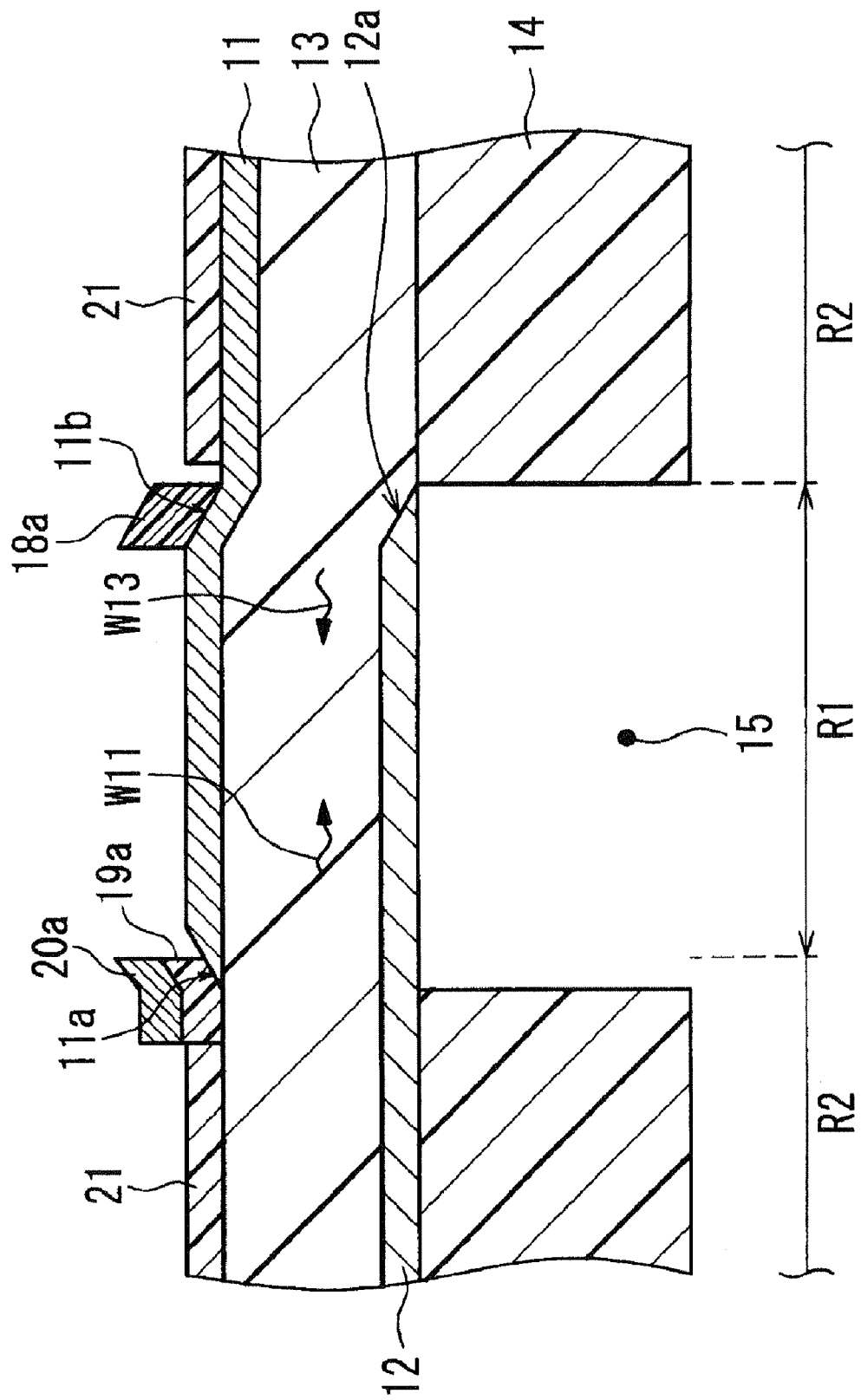

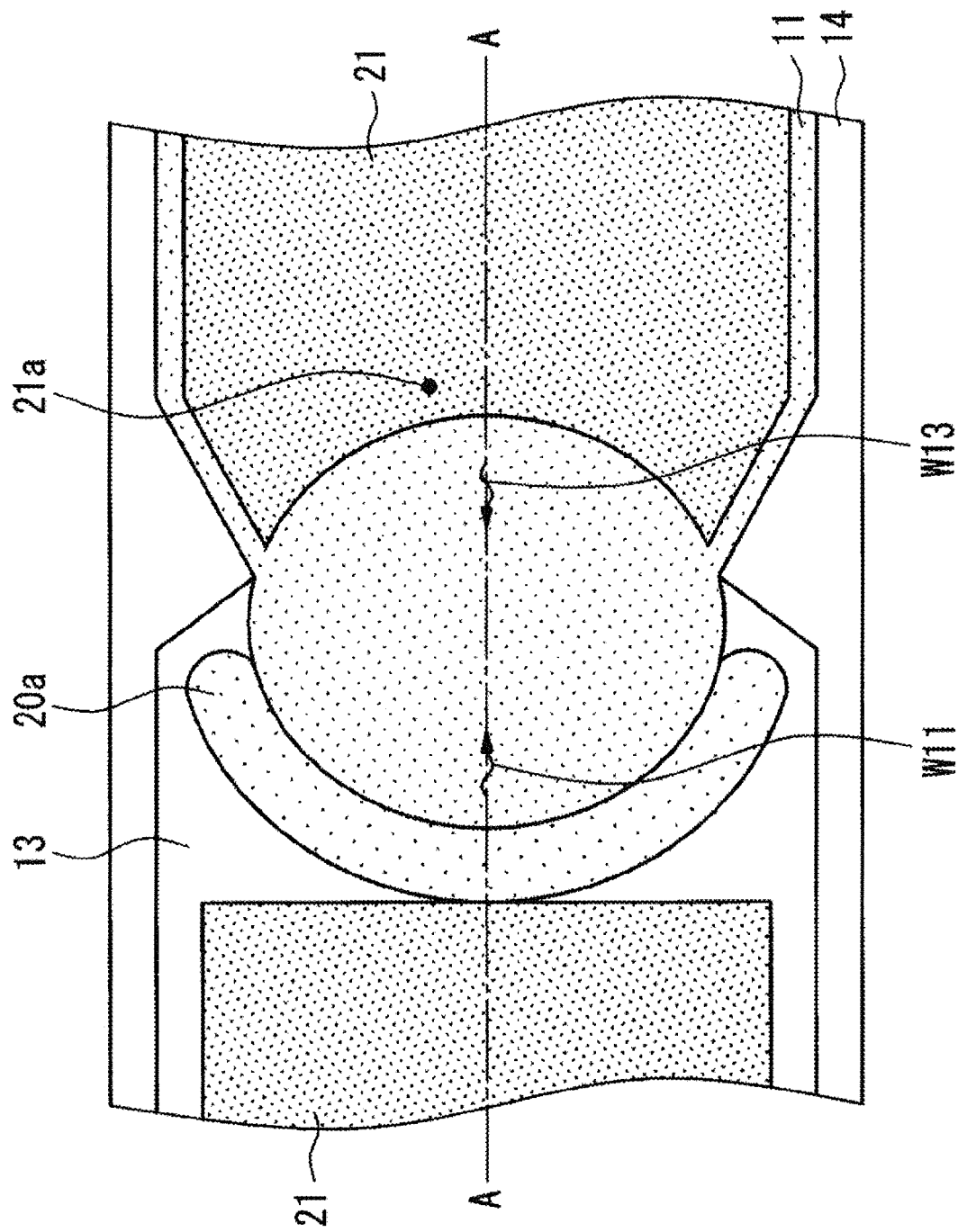

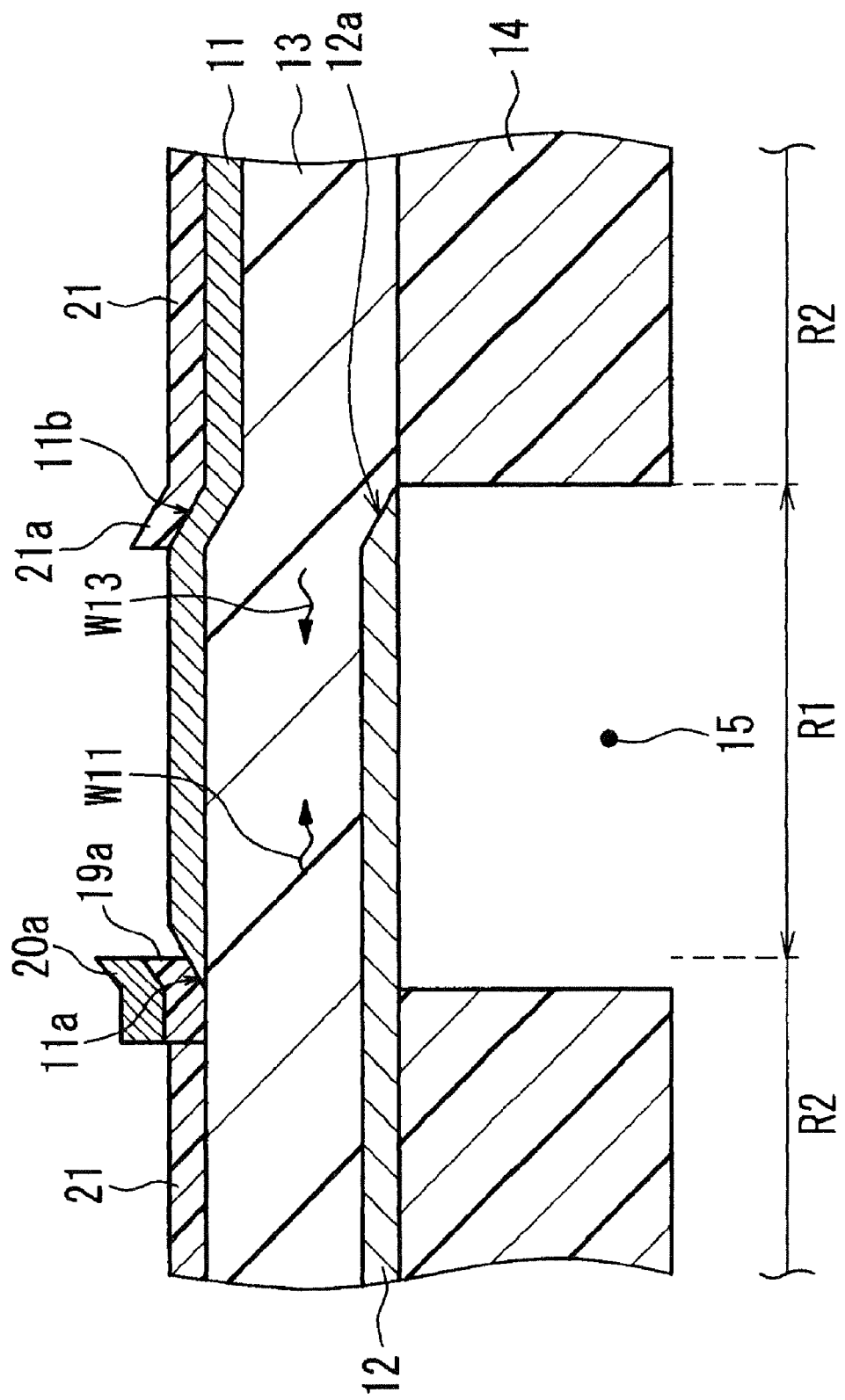

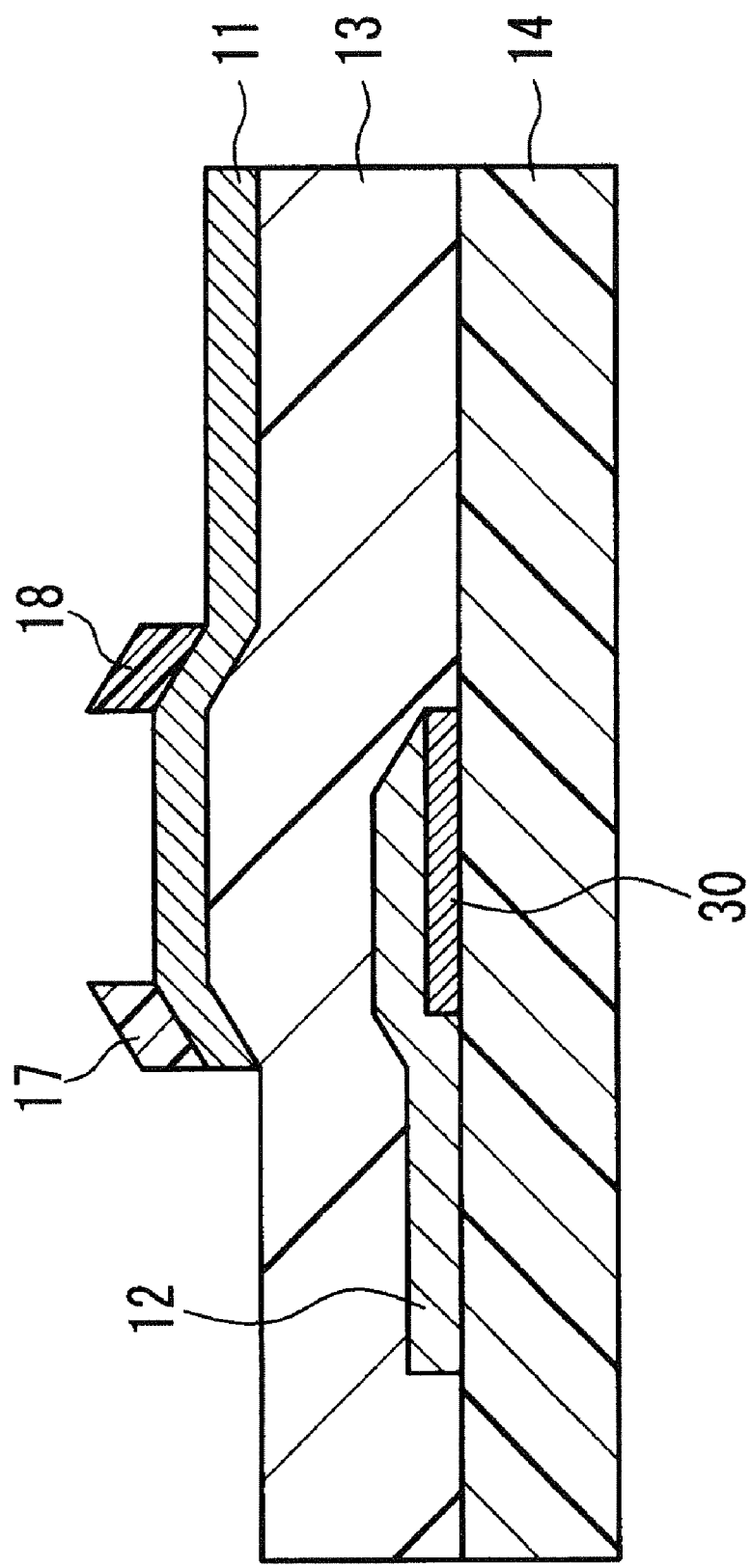

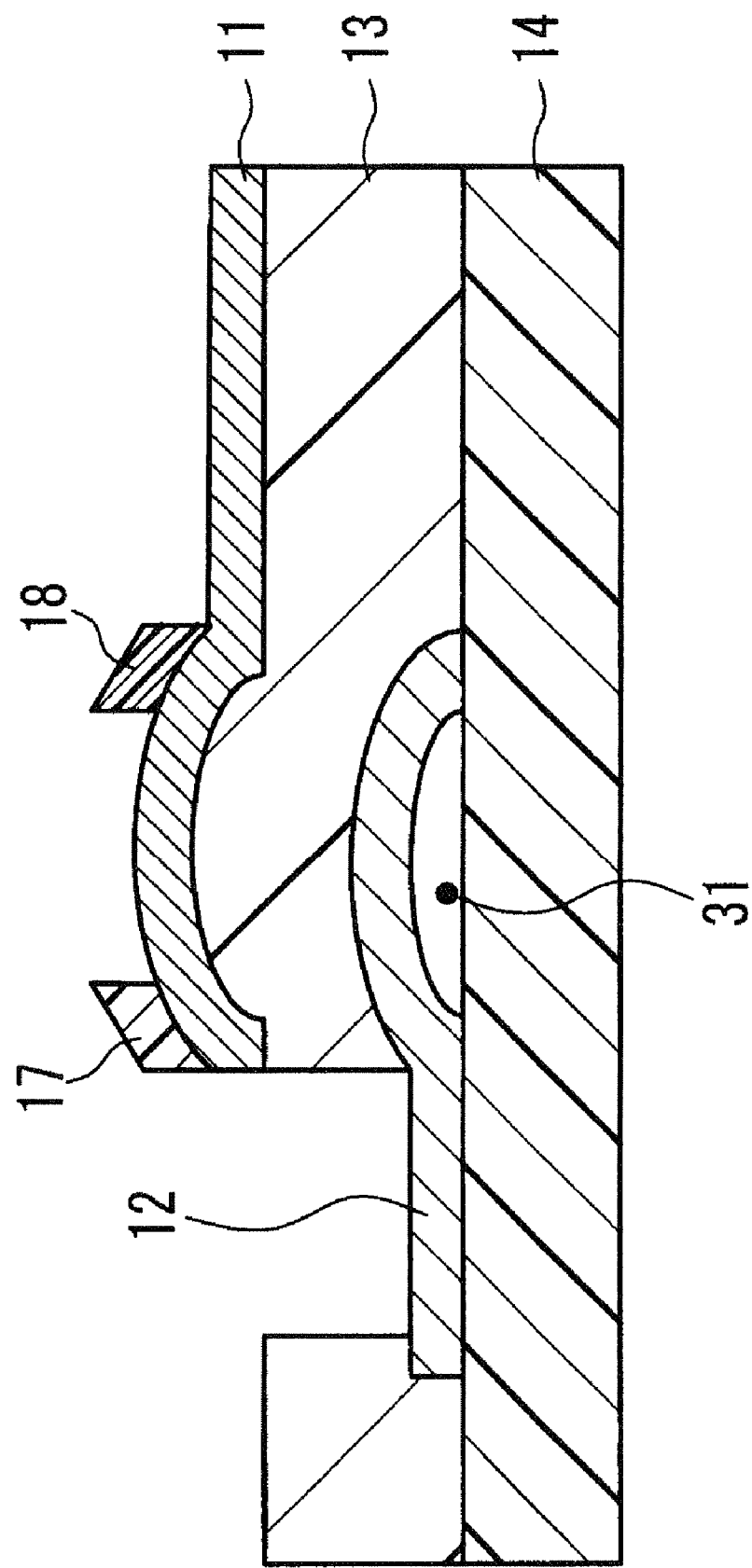

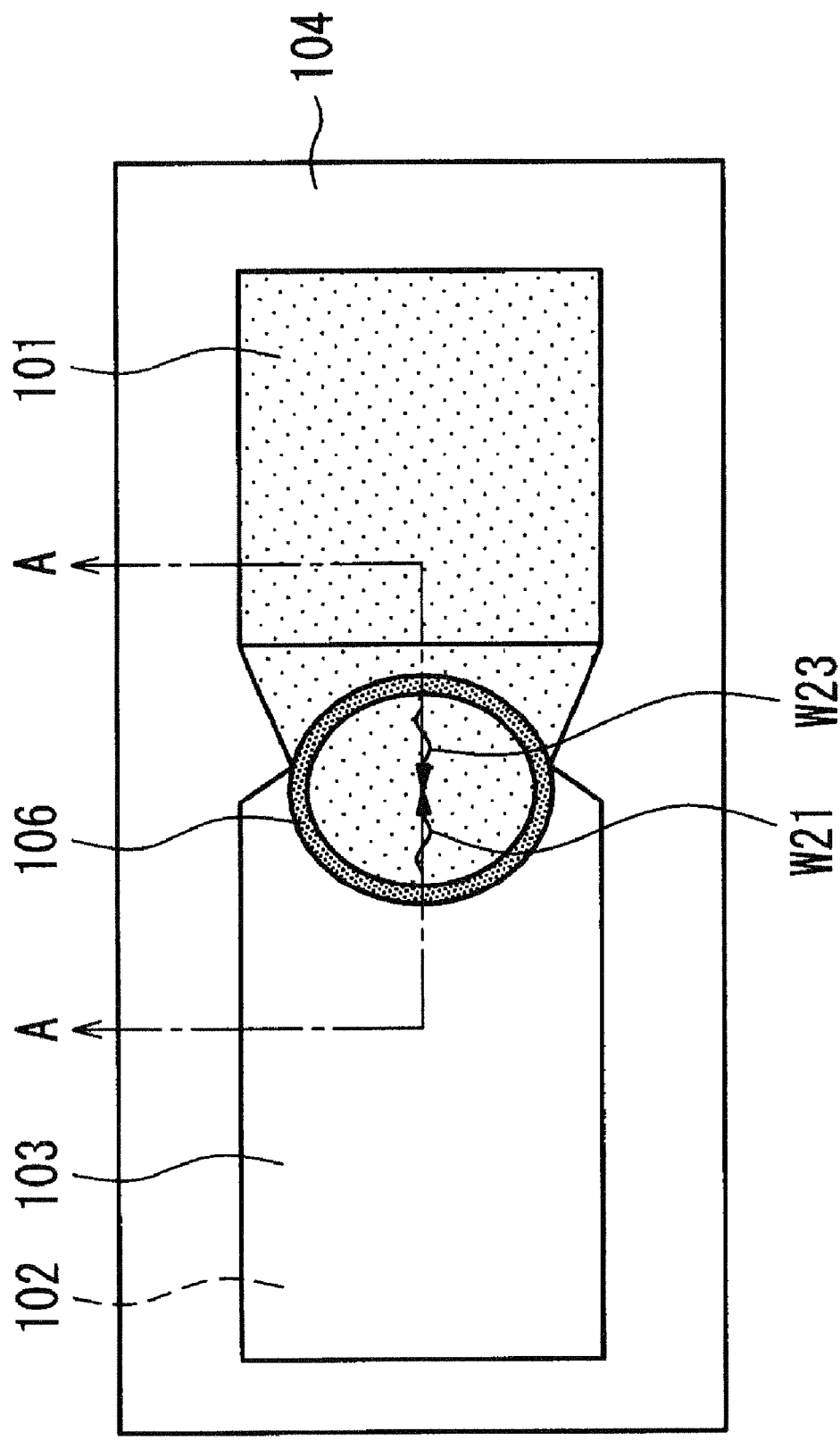

PIEZOELECTRIC THIN-FILM RESONATOR

CROSS-REFERENCE TO RELATED APPLICATIONS

This application is based upon and claims the benefit of priority of prior Japanese Patent Application No. 2008-38926, filed on Feb. 20, 2008, the entire contents of which are incorporated herein by reference.

FIELD

Aspects of the present examples relate to a Film Bulk Acoustic Resonator (FBAR) used in mobile communication and high-frequency radio communication such as mobile phones, cell-phones, and wireless LANs, and to a filter, duplexer, communication module, and communication apparatus using a piezoelectric thin-film resonator.

BACKGROUND

Attention is being given to FBARs, which are resonators using the thickness longitudinal vibration of a piezoelectric material, as filter elements for high-frequency communication.

FIG. 23 is a plan view of an FBAR. FIG. 24 is a cross-sectional view taken along line A-A in FIG. 23. As illustrated in FIGS. 23 and 24, the FBAR has a structure in which a piezoelectric film 103 is sandwiched by an upper electrode 101 and a lower electrode 102, and a region defined by the upper electrode 101 and the lower electrode 102 which are opposed to each other acts as an actual resonator (hereinafter referred to as the resonant portion R1). Provision of a cavity 105 or an acoustic reflector above and below the resonant portion R1 may prevent attenuation of elastic waves generated at the resonant portion R1 and provide a resonance characteristic with a high quality factor (Q).

As illustrated in FIG. 25, piezoelectric thin-film resonators have a vibration mode having a transversely propagating component (transverse mode) in a frequency band near the resonance frequency and the antiresonance frequency of the thickness vibration. A transverse-mode wave W1 is reflected by an edge of the resonant portion R1 (reflected wave W2) or passes through the edge of the resonant portion R1 to propagate to a nonresonant portion R2. The wave propagating to the nonresonant portion R2 will be lost (for example, if the reflection characteristic is represented by a Smith chart, a Q circle appears as a small circle). In an actual resonator structure, an edge of each of the upper electrode 101 and lower electrode 102 is sloped as illustrated in FIGS. 26 and 27A for convenience of manufacturing and the apparent acoustic impedance of the piezoelectric film 103 gradually decreases toward the nonresonant portion R2 as illustrated in FIG. 27B. (Apparent acoustic impedance Z exists as opposed to intrinsic acoustic impedance which would exist in the absence of a mass element, because acoustic impedance Z is equal to the density ρ of a material multiplied by speed of sound c and the speed of sound changes when a mass element is added to the piezoelectric film. Herein, the acoustic impedance is defined as being equal to the apparent acoustic impedance.)

In theory, in a resonator using a piezoelectric film having a Poisson ratio of 1/3 or less, transverse-mode waves tend to pass through the edge and be lost if the acoustic impedance of the portion surrounding the resonant portion is smaller than that of the resonant portion. Actual optical observations show that leaked waves exist outside the resonator. Therefore there is the problem of preventing the leaked waves.

Examples of conventional techniques for preventing leakage of transverse waves include the techniques disclosed in JP2003-505906 and JP2006-109472. These Japanese Laid-open Patent Publications disclose configurations in which the perimeter of a resonant portion R1 is uniformly enclosed by a layer 106 having a different acoustic characteristic as illustrated in FIGS. 28 and 29. The configurations may have the effect of preventing leakage of transverse waves as theoretically predicted because the acoustic impedance of the perimeter of the resonator is greater than the acoustic impedance of an exciting portion.

SUMMARY

According to an aspect of the invention, a piezoelectric thin-film resonator includes a substrate, a lower electrode disposed on the substrate, a piezoelectric film disposed on the lower electrode, an upper electrode disposed on the piezoelectric film in such a manner that a portion of the upper electrode is opposed to the lower electrode, a mass element disposed on the upper electrode in a portion of an edge of a region where the upper and lower electrodes are opposed to each other.

Additional objects and advantages of aspects in accordance with the present invention will be set forth in part in the description which follows, and in part will be obvious from the description, or may be learned by practice of the invention. The object and advantages of the aspects of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

FIG. 1 is a plan view illustrating a piezoelectric thin-film resonator according to a first embodiment;

FIG. 3 is a Smith chart providing a comparison of electrical characteristics between the piezoelectric thin-film resonator according to the embodiment and a conventional piezoelectric thin-film resonator;

FIG. 6 is a plan view of a piezoelectric thin-film resonator according to a second embodiment;

FIG. 8 is a plan view illustrating a piezoelectric thin-film resonator according to a third embodiment;

FIG. 11B is a cross-sectional view taken along line A-A in FIG. 11A;

FIG. 12A is a plan view of a relevant part of a piezoelectric thin-film resonator in a second example;

FIG. 13A is a plan view of a relevant part of a piezoelectric thin-film resonator in a third example;

FIG. 13B is a cross-sectional view taken along line A-A in FIG. 13A;

FIG. 14A is a plan view of a relevant part of a piezoelectric thin-film resonator in a fourth example;

FIG. 14B is a cross-sectional view taken along line A-A in FIG. 14A;

FIG. 15B is a cross-sectional view taken along line A-A in FIG. 15A;

FIG. 16B is a cross-sectional view taken along line A-A in FIG. 16A;

FIG. 17A is a plan view of a relevant part of a piezoelectric thin-film resonator in a seventh example;

FIG. 17B is a cross-sectional view taken along line A-A in FIG. 17A;

FIG. 18A is a plan view of a relevant part of a piezoelectric thin-film resonator in an eighth example;

FIG. 18B is a cross-sectional view taken long line A-A in FIG. 18A;

FIG. 19B is a cross-sectional view illustrating the fabrication process of the piezoelectric thin-film resonator according to the embodiment;

FIG. 19C is a cross-sectional view illustrating the fabrication process of the piezoelectric thin-film resonator according to the embodiment;

FIG. 28 is a plan view illustrating a conventional piezoelectric thin-film resonator;

DESCRIPTION OF EMBODIMENTS

The configurations disclosed in JP2003-505906 and JP2006-109472 have the following problems.

The publications describe that a change in the acoustic characteristic may be provided inside the exciting portion. However, providing a region having a different acoustic characteristic in a location that is an exciting portion adds a region where electric energy is not converted to sound waves, that is, the provision of the region decreases the electromechanical coupling coefficient, which indicates the performance of the resonator. This reduces the bandwidth of a fabricated filter.

Figure 23:
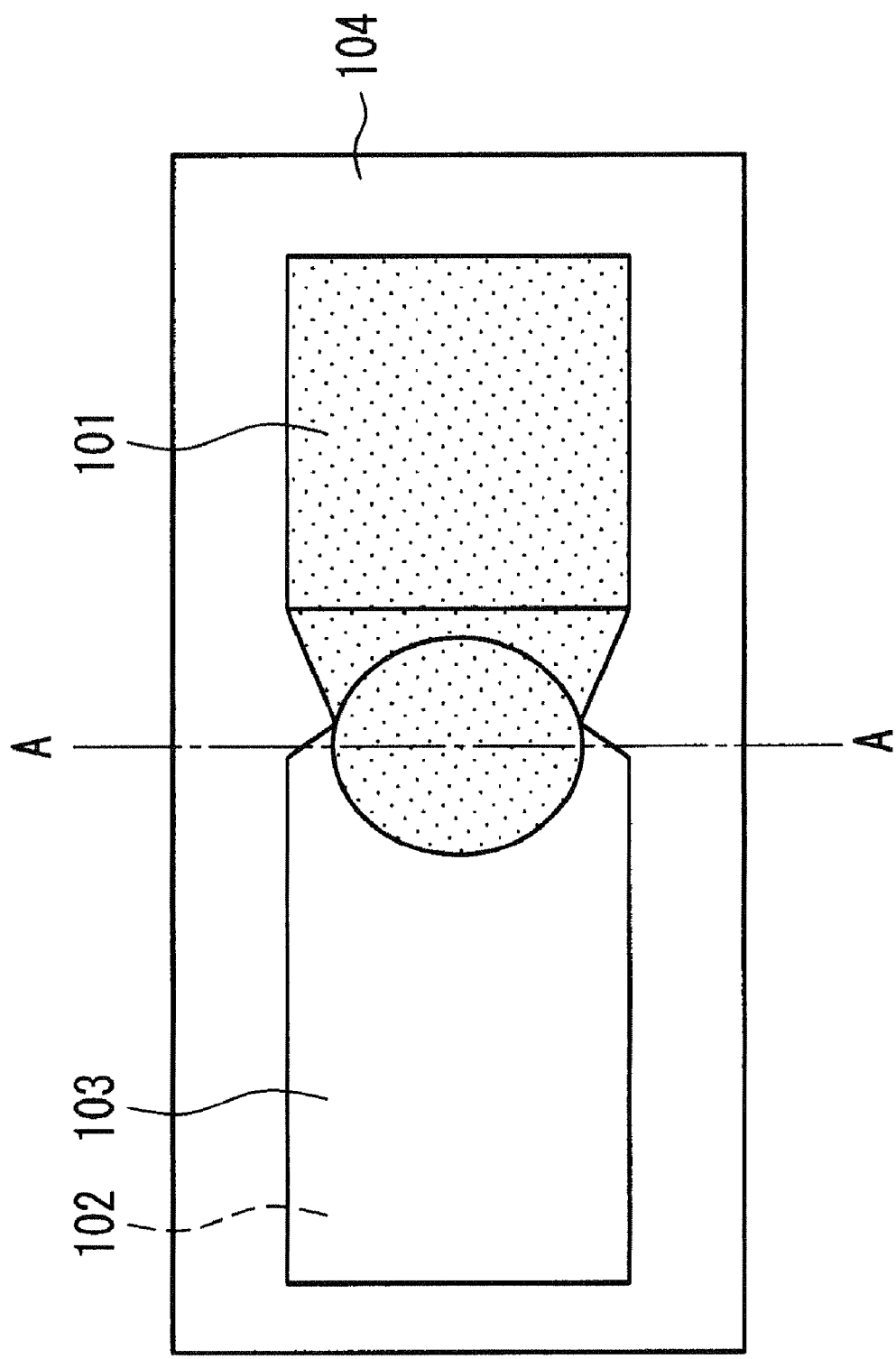
FIG. 23 is a cross-sectional view illustrating a basic configuration of a piezoelectric thin-film resonator.
Figure 24:
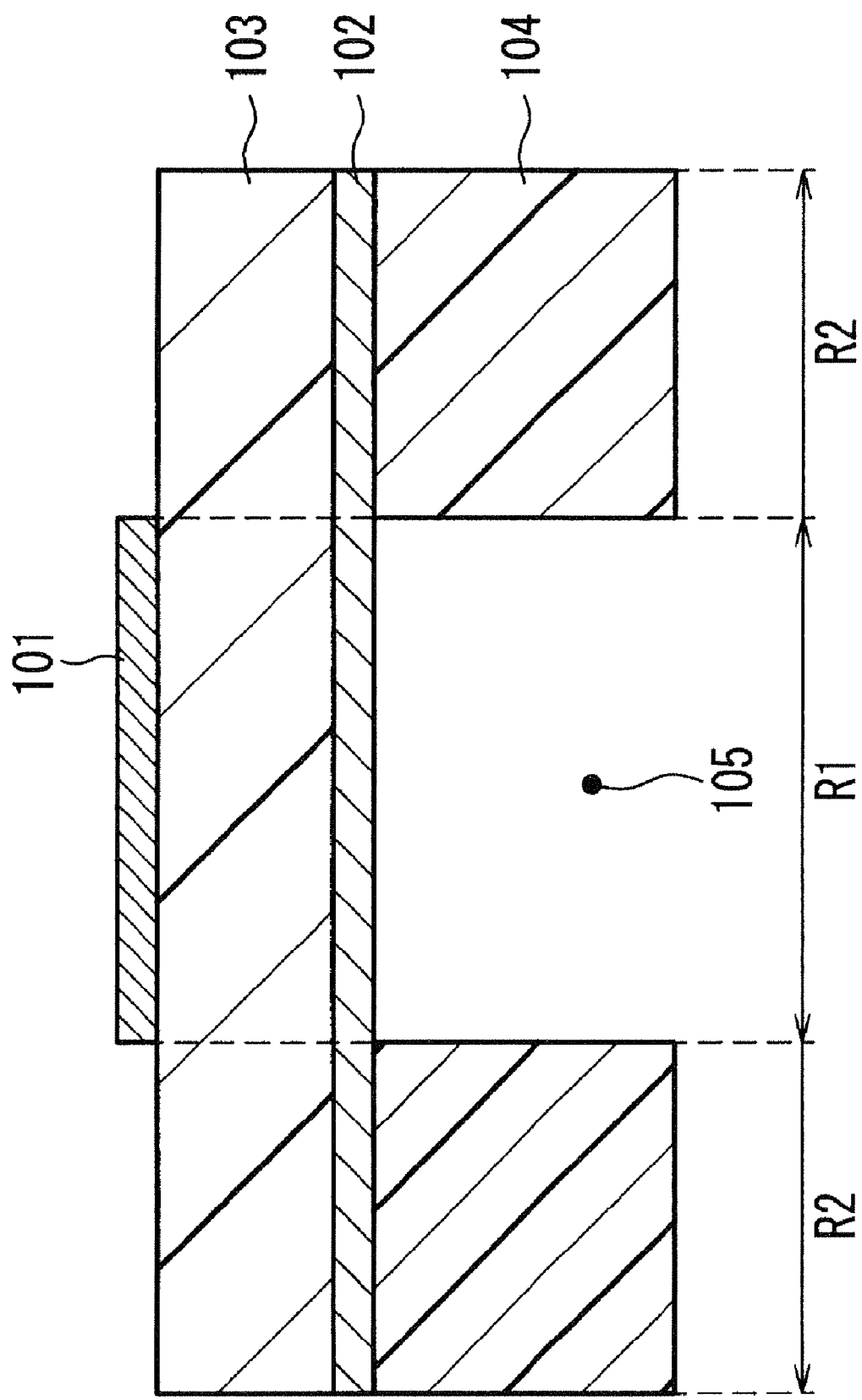
FIG. 24 is a plan view illustrating a conventional piezoelectric thin-film resonator.
Figure 25:
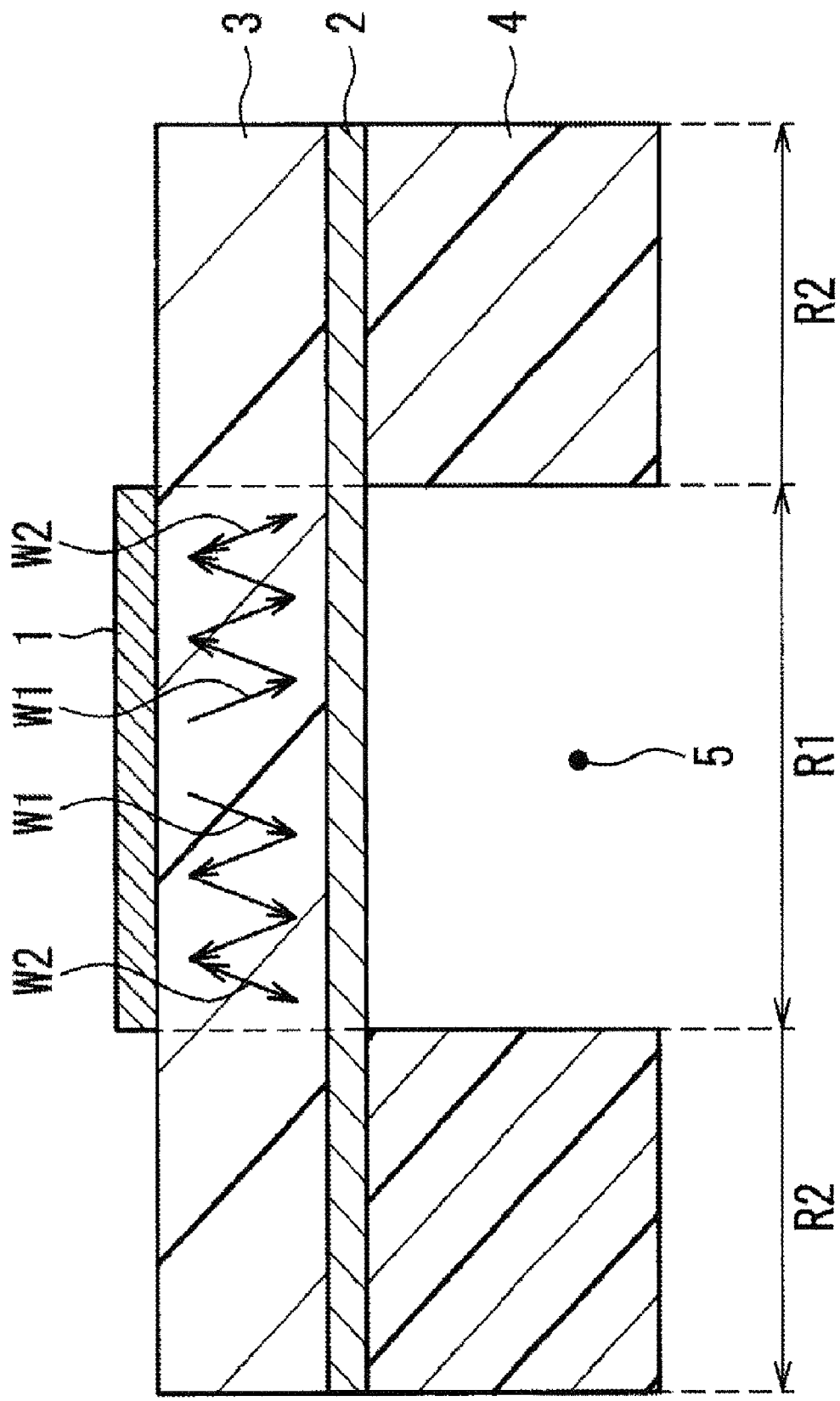
FIG. 25 is a cross-sectional view taken along line A-A in FIG. 24.
Figure 26:
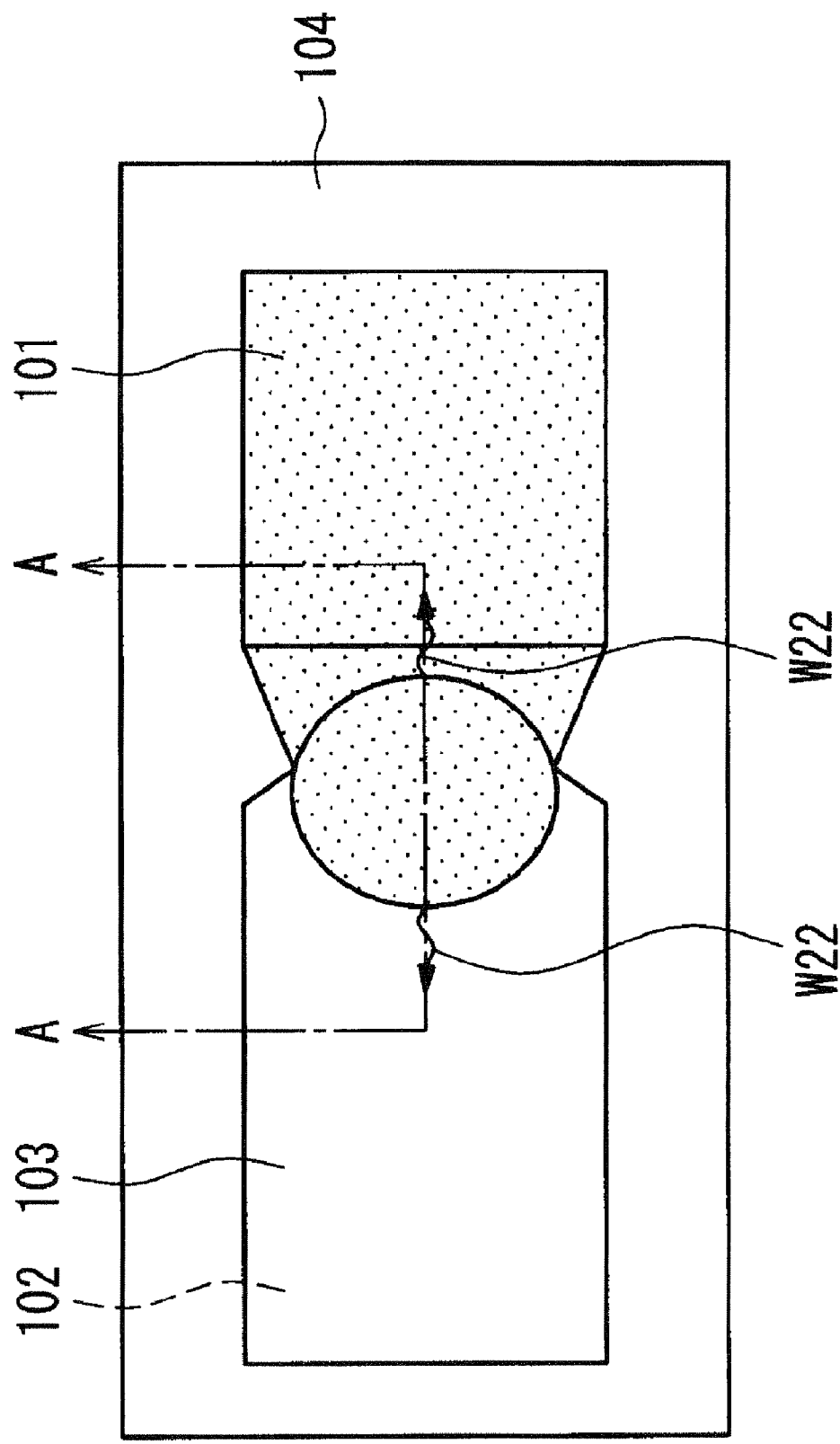
FIG. 26 is a plan view illustrating a conventional piezoelectric thin-film resonator.
Figures 27A, 27B:
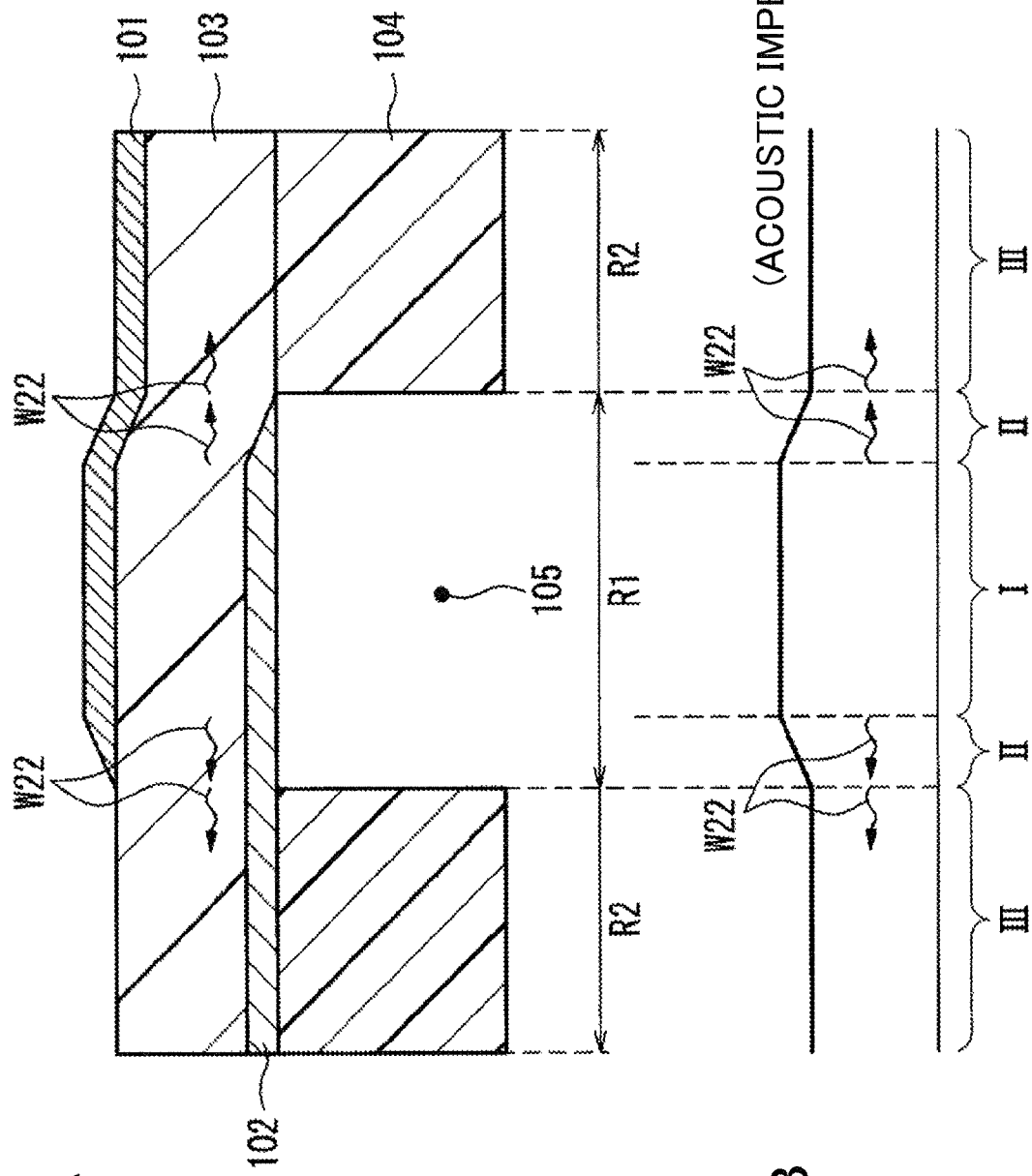
FIG. 27A is a cross sectional view taken along line A-A in FIG. 26.
FIG. 27B is an acoustic impedance characteristic diagram.
Figures 29A, 29B:
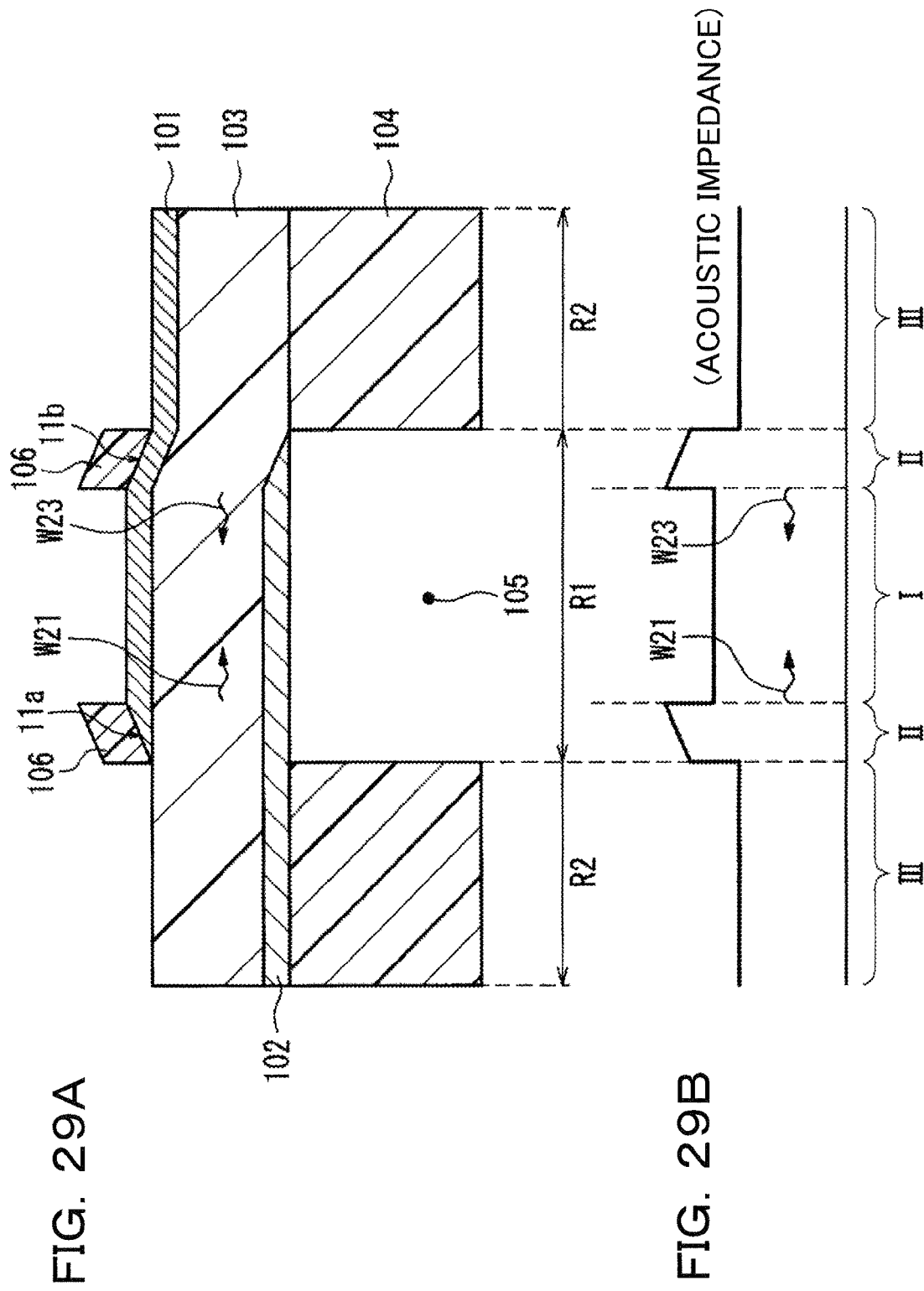
FIG. 29A is a cross-sectional view taken along line A-A in FIG. 28.
FIG. 29B is an acoustic impedance characteristic diagram.
Figure 30:
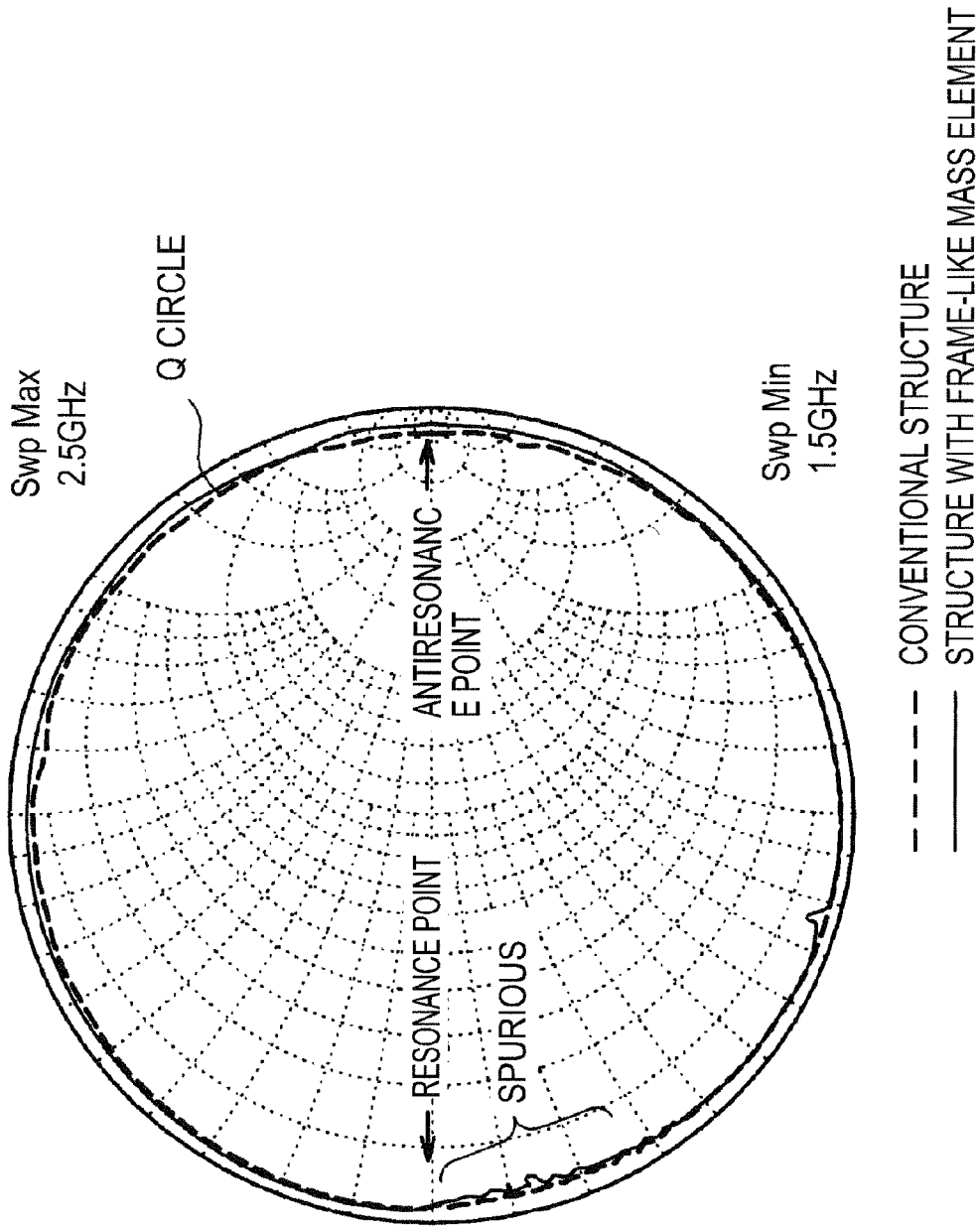
FIG. 30 is a Smith chart providing a comparison of electrical characteristics between structures with and without a mass element.
Figure 31:
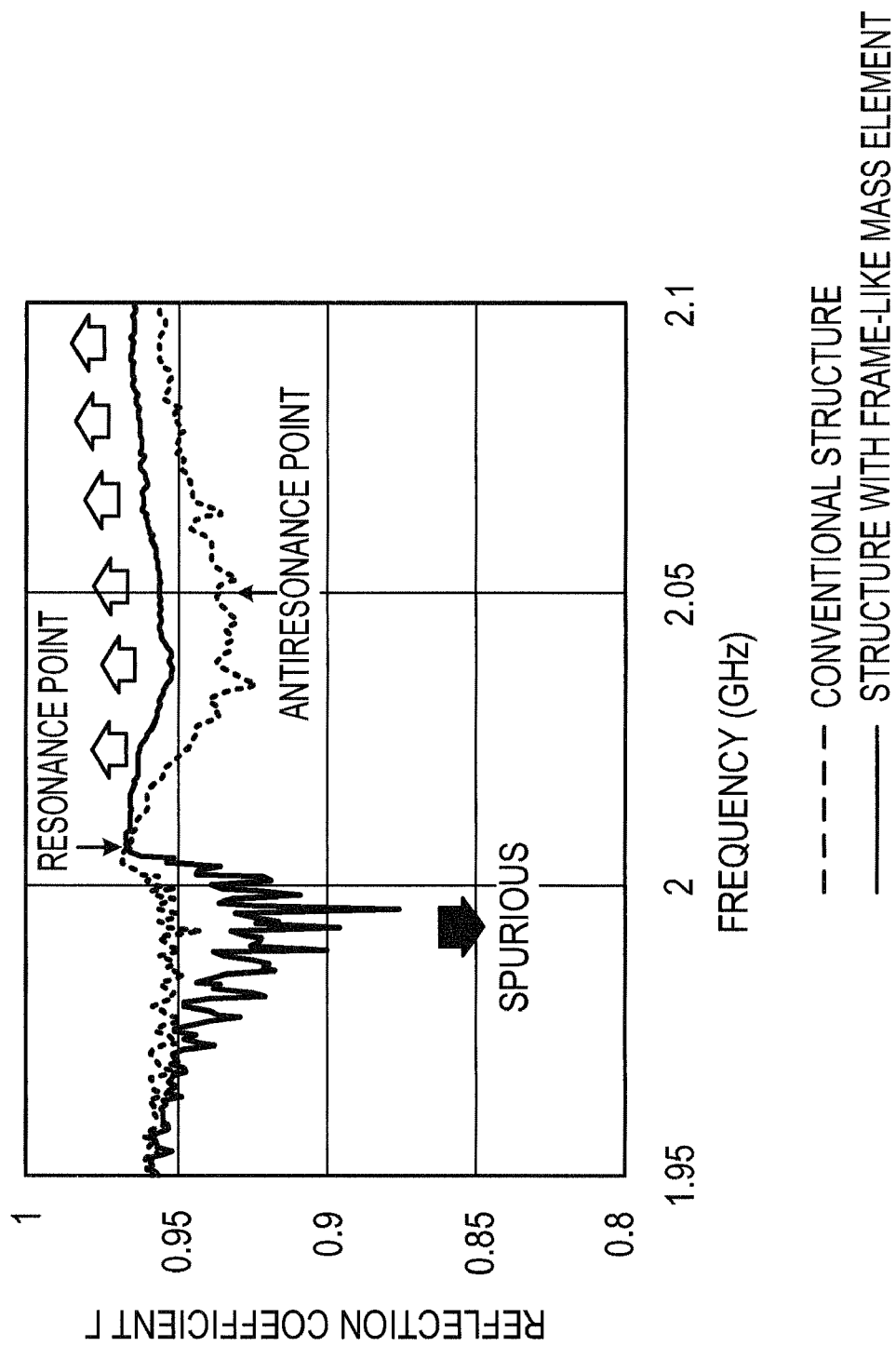
FIG. 31 is a characteristic diagram providing a comparison of electrical characteristics between structures with and without the mass element.
Figure 32:
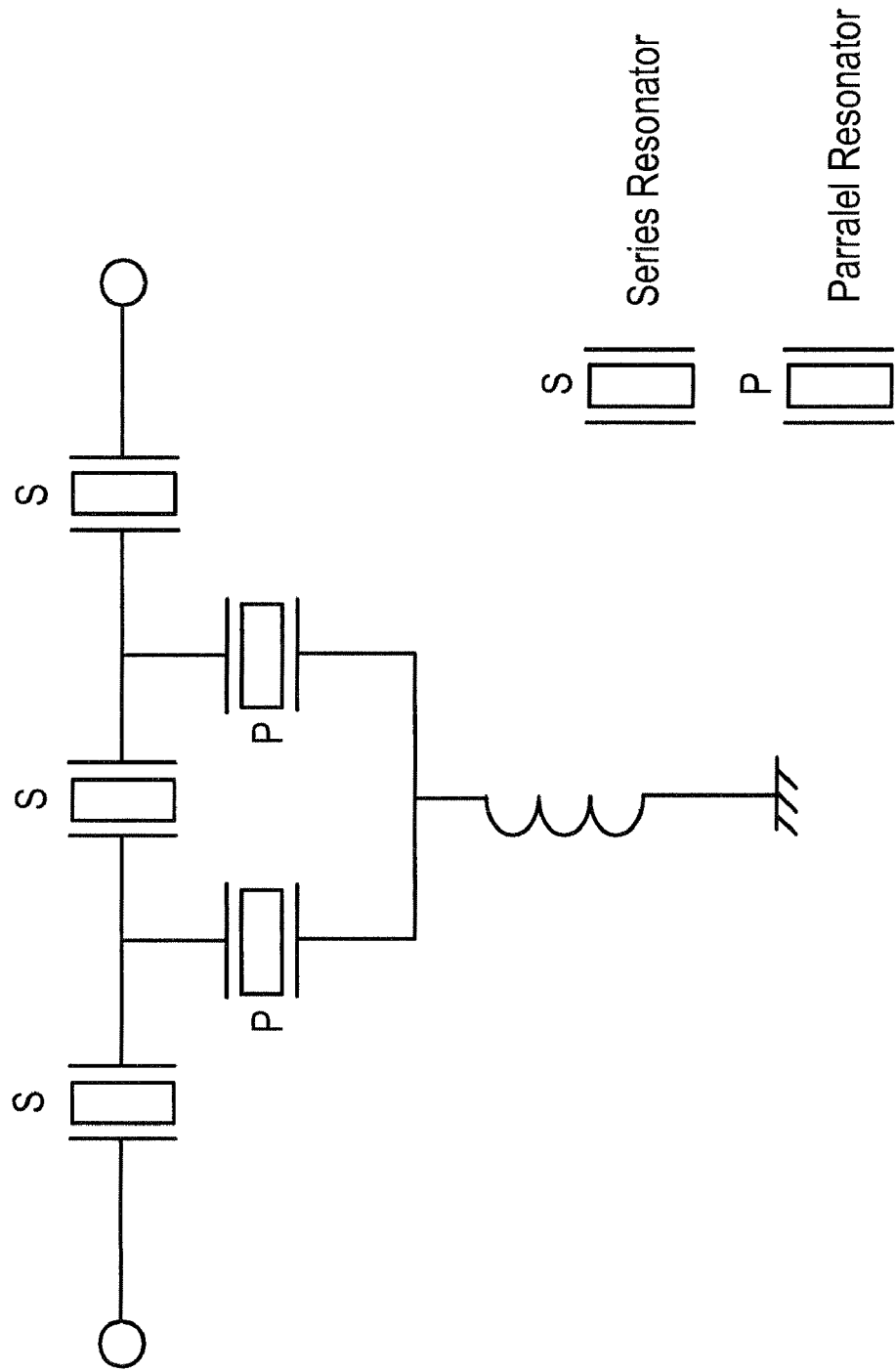
FIG. 32 is a circuit diagram illustrating a basis configuration of a filter.
Figure 33:
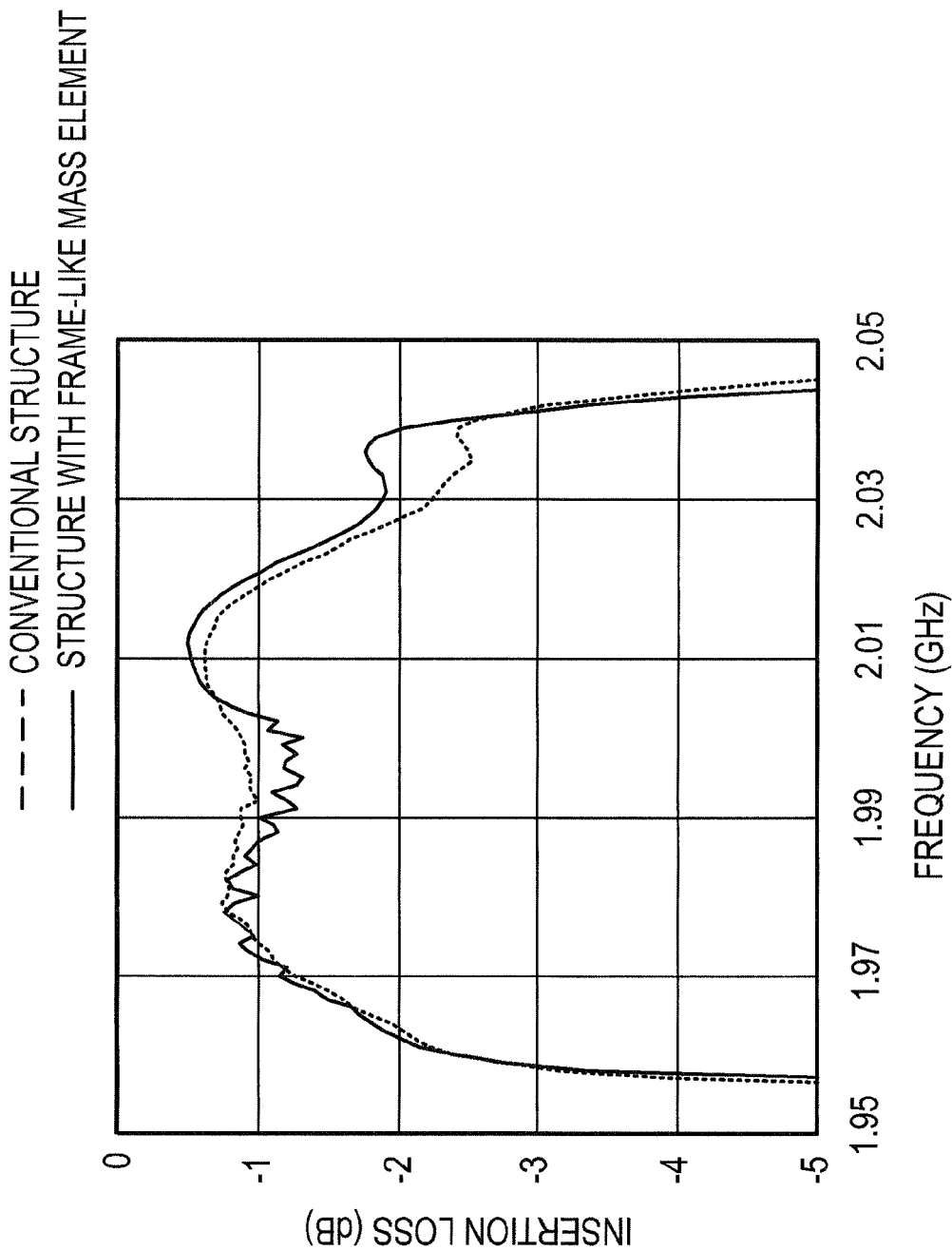
FIG. 33 is a characteristic diagram providing a comparison of electrical characteristics between structures with and without an acoustic characteristic difference.

In addition, the configurations disclosed in the publications are characterized by a structure in which the exciting portion is framed so that the portions inside and outside the frame have different acoustic impedances. However, this poses a problem wherein transverse waves confined in the exciting portion form a mode of strong standing waves inside the exciting portion. FIGS. 30 and 31 illustrate electrical characteristics of the basic resonator illustrated in FIGS. 23 and 24 and the resonator illustrated in FIGS. 28 and 29. Comparison between the electrical characteristics of the resonators shows that spike-like (spurious) loss points () are generated in a region on the low-frequency side of the resonance point which are caused by the generation of strong standing waves. This causes, as illustrated in FIG. 33, spike-like losses (spuriouses) in a passing band of a ladder filter fabricated using such resonators, as illustrated in FIG. 32, thereby exacerbating insertion loss, EVM (Error Vector Magnitude) and other measures.

Aspects of the present example provide a piezoelectric thin-film resonator having a sloped portion surrounding a resonant portion wherein the reduction of an electromechanical coupling coefficient and the increase of the intensity of a standing wave mode are suppressed as compared with a conventional piezoelectric thin-film resonator while preventing energy dissipation of transverse waves. This is accomplished by adding a mass element so that the acoustic impedance of the sloped portion becomes greater than that the region inward from the sloped portion and by designing the opposed sides to have different acoustic impedances. Furthermore, there are provided a filter, duplexer, communication module, and communication apparatus using the piezoelectric thin-film resonator.

MEANS FOR SOLVING THE PROBLEMS

The piezoelectric thin-film resonator according to aspects of the present example includes a substrate, an upper electrode and a lower electrode disposed on the substrate in such a manner that portions of the upper and lower electrodes are opposed to each other, and a piezoelectric film disposed between the upper and lower electrodes. The piezoelectric thin-film resonator includes a mass element disposed on the upper electrode. The mass element on the upper electrode is disposed on an edge portion of the upper electrode in the region opposed to the lower electrode.

ADVANTAGES OF THE INVENTION

According to the present example, a piezoelectric thin-film resonator may be implemented in which energy dissipation of transverse waves is prevented and reduction of the electromechanical coupling coefficient and increase of the intensity of standing wave mode are suppressed. In addition, by including such a piezoelectric thin-film resonator in a filter, duplexer, communication module, and communication apparatus, the filtering characteristic and/or communication quality may be improved.

The piezoelectric thin-film resonator according to aspects of the present example includes a substrate, an upper electrode and a lower electrode disposed on the substrate in such a manner that portions of the upper and lower electrodes are opposed to each other, and a piezoelectric film disposed between the upper and lower electrodes. The piezoelectric thin-film resonator includes a mass element disposed on the upper electrode. The mass element on the upper electrode is disposed on a portion of an edge of the upper electrode in the region opposed to the lower electrode.

The piezoelectric thin-film resonator described above is capable of confining transverse-mode waves in the piezoelectric film and, since a mass element is not added to the entire boundary, an increase of the intensity of transverse-mode standing waves can be prevented by appropriately choosing portions to which the mass element will not be added.

In the piezoelectric thin-film resonator according to aspects of the present example, a boundary is formed surrounding the region defined by the upper electrode and the lower electrode being opposed to each other. The mass element is disposed in a position where an apparent acoustic impedance of a portion of the piezoelectric film at and beyond the boundary is greater than an apparent acoustic impedance of the piezoelectric film in a region on the inside of the boundary.

The piezoelectric thin-film resonator described above is capable of confining transverse-mode waves in the piezoelectric film and, since a mass element is not added to of the entire boundary, an increase of the intensity of transverse-mode standing waves can be prevented by appropriately choosing portions to which the mass element will not be added.

In the piezoelectric thin-film resonator according to aspects of the present example, the mass element is disposed so that an apparent acoustic impedance of the piezoelectric film at a boundary coinciding with an edge of the upper electrode at the region defined by the upper electrode and the lower electrode being opposed to each other and the apparent impedance of the piezoelectric film at a region outside the region differs from an apparent acoustic impedance of the piezoelectric film at a boundary not coinciding with the edge of the upper electrode.

The piezoelectric thin-film resonator described above is capable of confining transverse-mode waves in the piezoelectric film and, since transverse-mode waves reflected by the boundaries having different acoustic impedances are not in phase with each other, capable of preventing an increase of the intensity of transverse-mode standing waves.

In the piezoelectric thin-film resonator according to the present example, at least a portion of the mass element includes a dielectric or a piezoelectric and the dielectric or the piezoelectric is in contact with the upper electrode.

In the piezoelectric thin-film resonator described above, the mass element may be added to a location as close to the boundary as possible. Accordingly, reduction of the area contributing vibration by the addition of the mass element may be minimized and therefore reduction in the electromechanical coupling coefficient $k^2$ may be prevented.

In the piezoelectric thin-film resonator according to aspects of the present example, the upper electrode includes a sloped portion at a boundary between a region opposed to the lower electrode and a region outside the region, the sloped portion having an angle of less than 90 degrees.

The piezoelectric thin-film resonator fabricated as described above has a good quality because geometric discontinuity and trouble in manufacturing caused by steps in weighting at boundaries may be prevented.

In the piezoelectric thin-film resonator according to the present example, the mass element is made of titanium (Ti) or gold (Au).

The piezoelectric thin-film resonator fabricated as described above is capable of confining transverse waves while reducing series resistance of the resonator and therefore has a high quality factor.

In the piezoelectric thin-film resonator according to the present example, the region defined by the upper electrode and the lower electrode being opposed to each other is elliptical in shape as viewed in the direction normal to the principal plane of the upper electrode.

The piezoelectric thin-film resonator described above is capable of further suppressing an increase of the intensity of transverse-mode standing waves because even if transverse waves are reflected at the boundary between the resonant and nonresonant portions, reflected waves in a particular direction do not strengthen one another.

In the piezoelectric thin-film resonator according to the present example, the region defined by the upper electrode and the lower electrode being opposed to each other is nonrectangular polygonal in shape as viewed in the direction normal to the principal plane of the upper electrode.

The piezoelectric thin-film resonator described above is capable of further suppressing an increase of the intensity of transverse-mode standing waves because even if transverse waves are reflected at the boundary between the resonant and nonresonant portions, reflected waves in a particular direction do not strengthen one another.

In the piezoelectric thin-film resonator according to the present example, the sloped portion is formed by dry etching.

In the piezoelectric thin-film resonator described above, the sloped portion may be formed with a high degree of precision.

In the piezoelectric thin-film resonator according to aspects of the present example, the dielectric is made of silicon oxide ($SiO_2$).

In the piezoelectric thin-film resonator according to aspects of the present example, at least portions of the upper and lower electrodes that are in contact with the piezoelectric film are made of ruthenium (Ru).

Embodiments

Figures 2A, 2B:
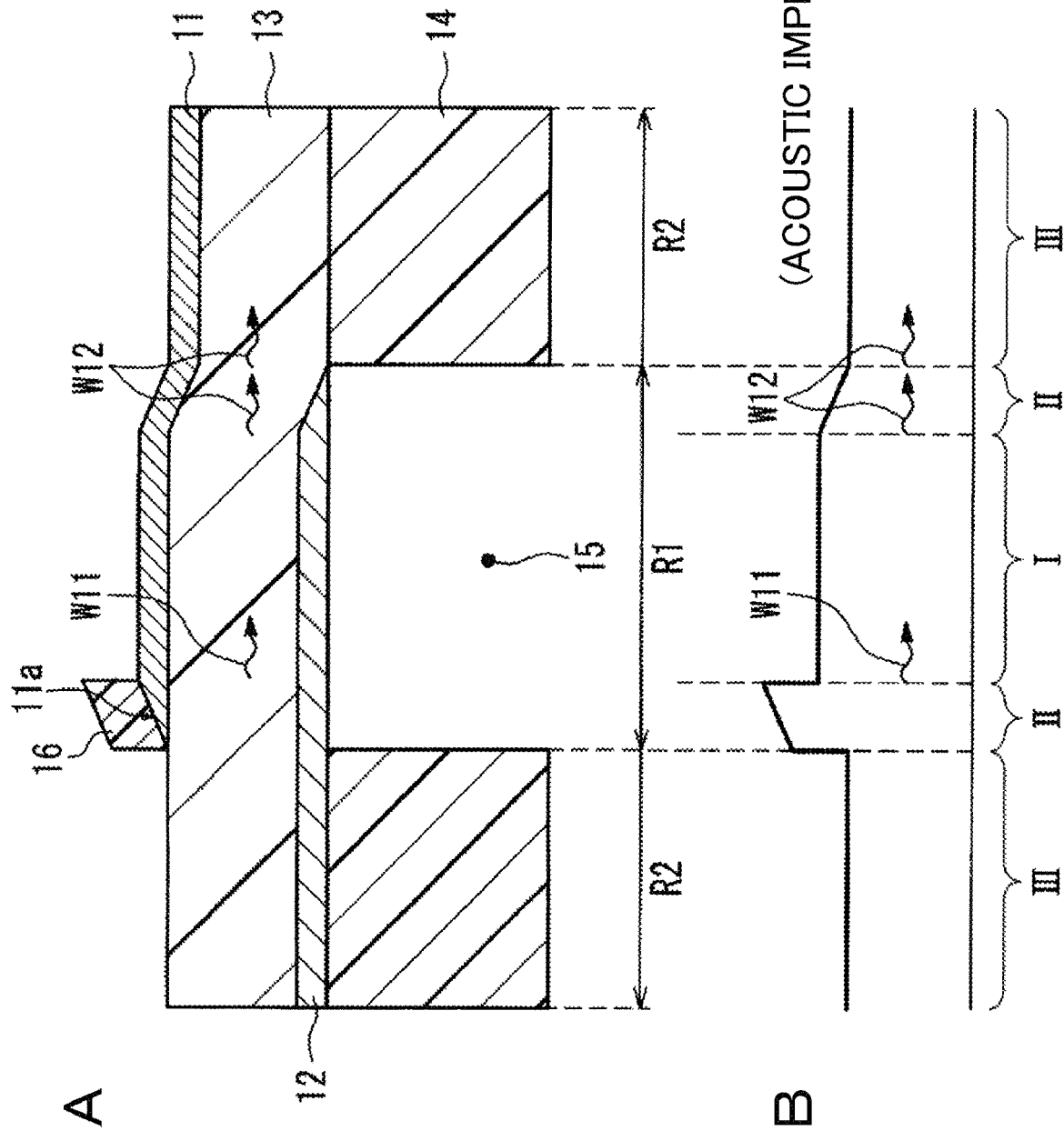
FIG. 2A is a cross-sectional view taken along line A-A in FIG. 1.
FIG. 2B is an acoustic impedance characteristic diagram.

FIG. 1 is a plan view of a piezoelectric thin-film resonator according to aspects of a first embodiment of the present invention. FIG. 2A is a cross-sectional view taken along line A-A in FIG. 1. FIG. 2B illustrates acoustic impedances in the piezoelectric thin-film resonator illustrated in FIGS. 1 and 2A. As illustrated in FIGS. 1 and 2, the piezoelectric thin-film resonator of the embodiment includes an upper electrode 11 and a lower electrode 12 that are provided on a substrate 14 and that sandwich a piezoelectric film 13. The region between the upper and lower electrodes 11 and 12 opposed to each other is a resonant portion R1 and the region surrounding the region R1 is a nonresonant portion R2. Formed below the resonant portion R1 is a cavity 15 or an acoustic multilayered film (not illustrated). A wave generated in the resonant region R1 is reflected by an edge of the resonant portion R1 (reflected wave W11) or leaks to the nonresonant portion R2 (leakedleaked wave W12).

A feature of the embodiment is that a mass element 16 is provided along a sloped portion 11a of the upper electrode 11 at the boundary between the resonant portion R1 and the nonresonant portion R2. The mass element 16 may be made of any of a dielectric, piezoelectric, metal and the like. The provision of the mass element 16 increases the acoustic impedance of the sloped portion 11a and provides a structure that confines elastic waves W11 generated in the resonant portion R1 to the resonant portion R1.

Here, it is also a feature of the embodiment that the mass element 16 is not added to at least a portion of the perimeter of the resonant portion R1. In the structure illustrated in FIGS. 1 and 2, the arch-shaped mass element 16 is added only to a side of the edge of the upper electrode 11 (see FIG. 1) but not to other side. By adding the mass element 16 only to a portion of the perimeter of the resonant portion R1, only some of elastic waves W11 are allowed to pass to the nonresonant portion R2 through the portion to which the mass element 16 is not added (leakedleaked waves W12) and standing waves may be prevented from strengthening each other in the resonant portion R1.

Figure 4:
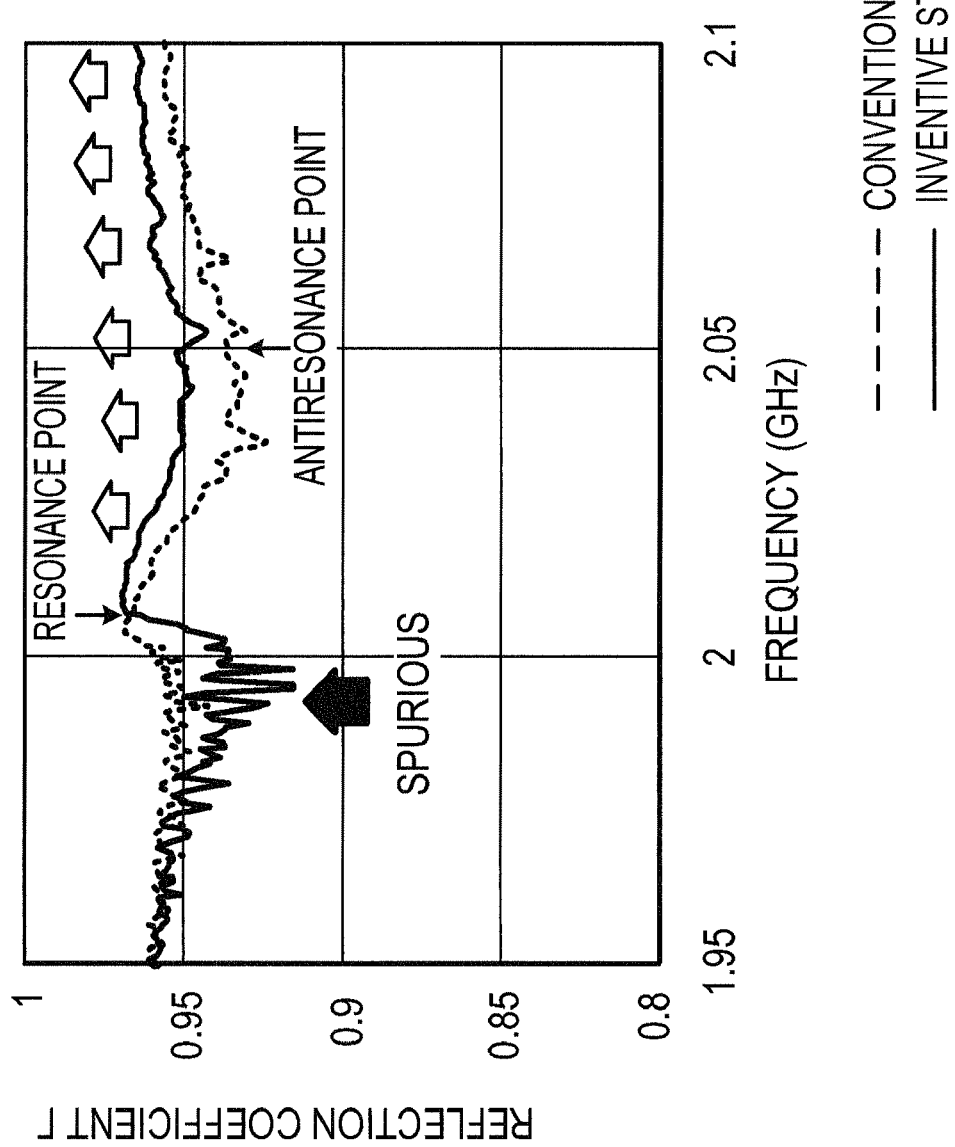
FIG. 4 is a characteristic diagram providing a comparison of electrical characteristics between the piezoelectric thin-film resonator according to the embodiment and the conventional piezoelectric thin-film resonator.
Figure 5:
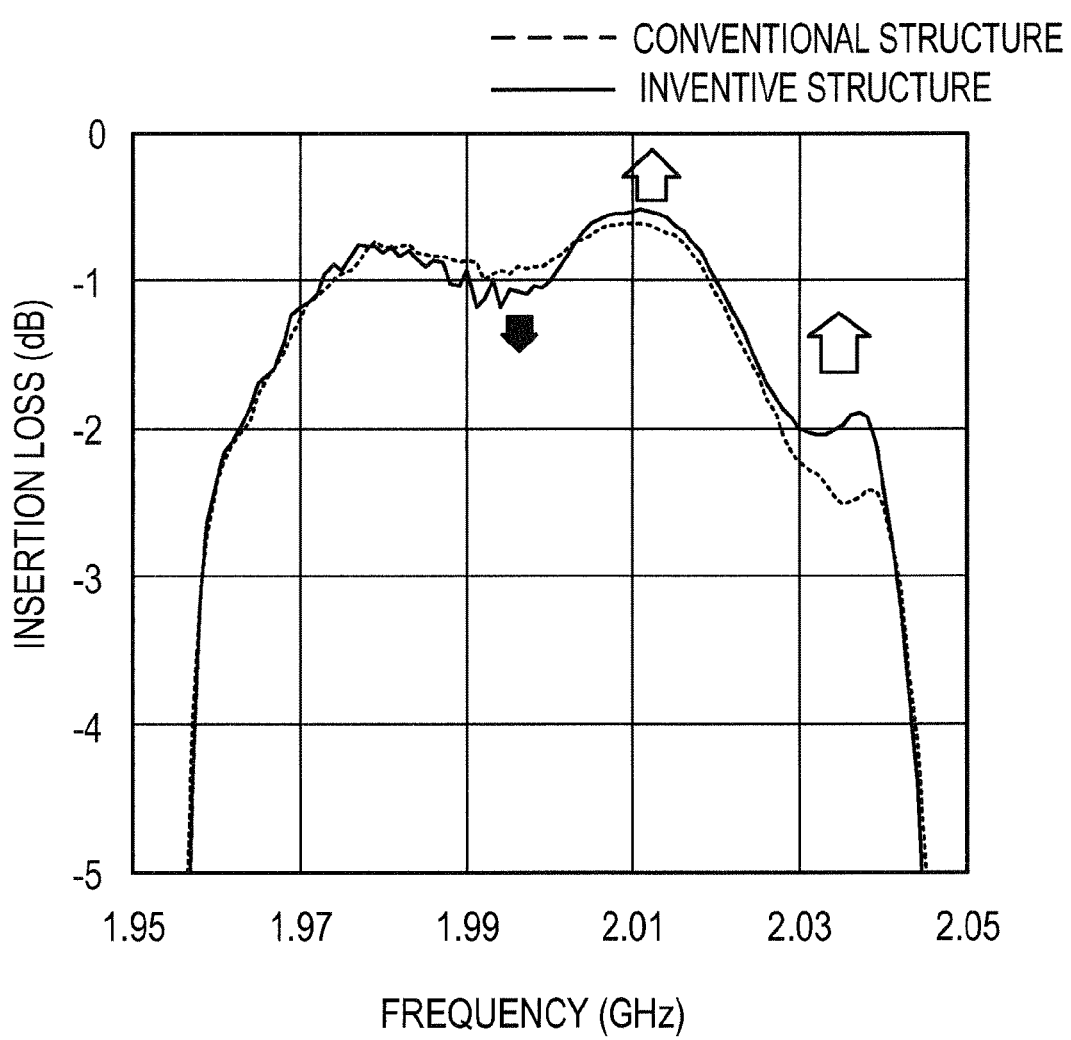
FIG. 5 is a chart providing a comparison of electrical characteristics between the piezoelectric thin-film resonator according to the embodiment and the conventional piezoelectric thin-film resonator.

FIGS. 3, 4, and 5 illustrate the results of experiments confirming the suppression of standing waves. As illustrated in FIGS. 3 to 5, the experiments illustrate that, as compared with the characteristics of the conventional resonator illustrated in FIGS. 23 and 24, the reflection coefficient increases near the antiresonance point and the leakage of transverse waves may be prevented by adding the mass element 16 only to a portion of the perimeter of the resonant portion R1, as in the embodiment. The experiments also show that the generation of standing waves may be suppressed, as compared with the configuration in which a mass element is added to the entire perimeter of the resonant portion R1 as illustrated in FIGS. 28 and 29.

Figures 7A, 7B:
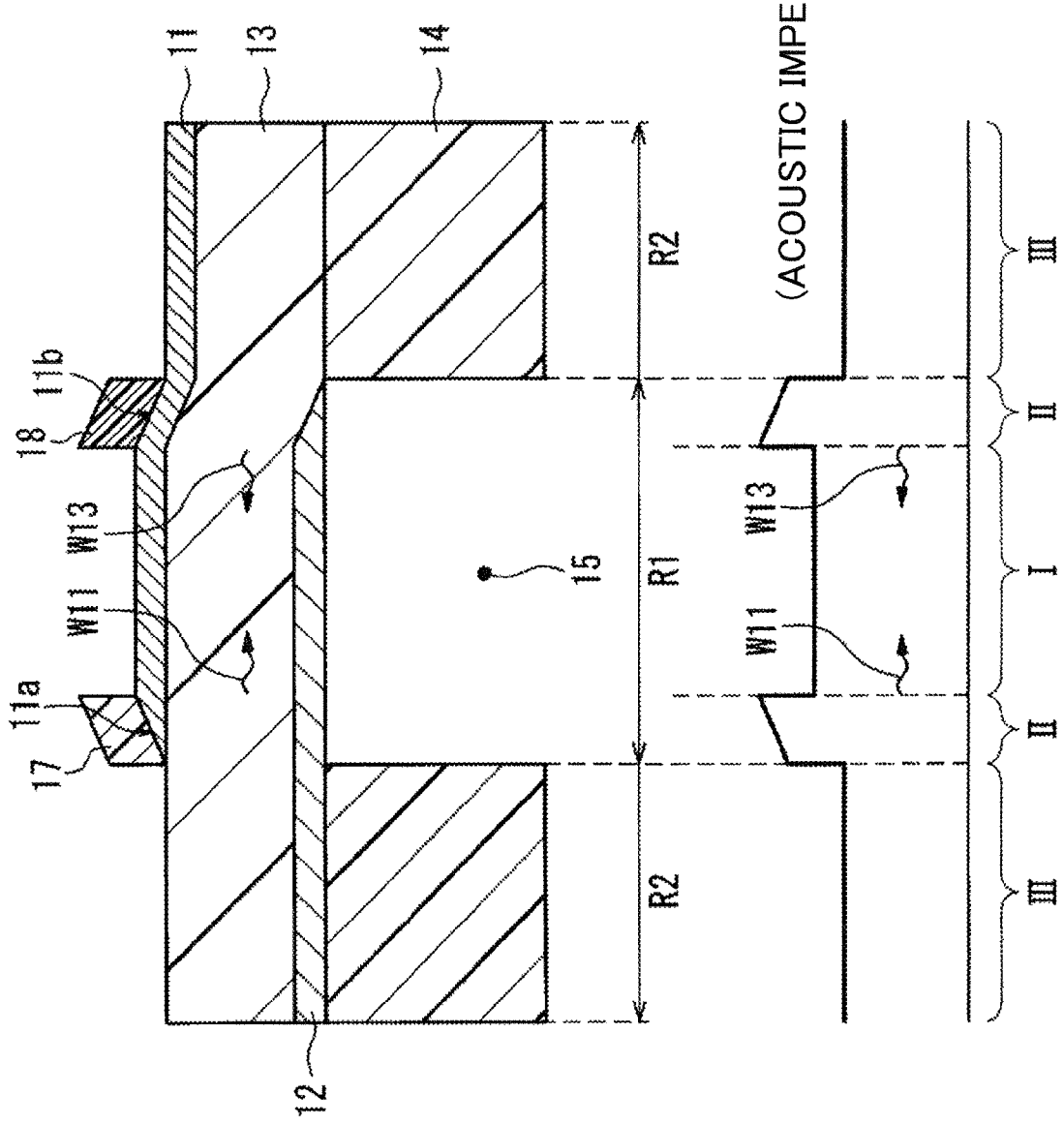
FIG. 7A is a cross-sectional view taken along line A-A in FIG. 6.
FIG. 7B is an acoustic impedance characteristic diagram.

FIG. 6 is a plan view of a piezoelectric thin-film resonator according to a second embodiment of the present invention. FIG. 7A is a cross-sectional view taken along line A-A in FIG. 6. FIG. 7B illustrates acoustic impedances in the piezoelectric thin-film resonator illustrated in FIGS. 6 and 7. The second embodiment is characterized in that a mass element is added to the entire perimeter of a resonant portion R1. Mass element 17 is added to a sloped portion 11a of an upper electrode 11, and mass element 18 is added to a sloped portion 11b opposed to the sloped portion 11a. Mass element 17 and mass element 18 may have different masses. The second embodiment configured as described above makes it possible to suppress transverse standing waves from strengthening one another, because the opposed sides of the perimeter of the resonant portion R1 have different acoustic impedances and therefore waves reflected from the sides are not in phase with each other.

Figures 9A, 9B:
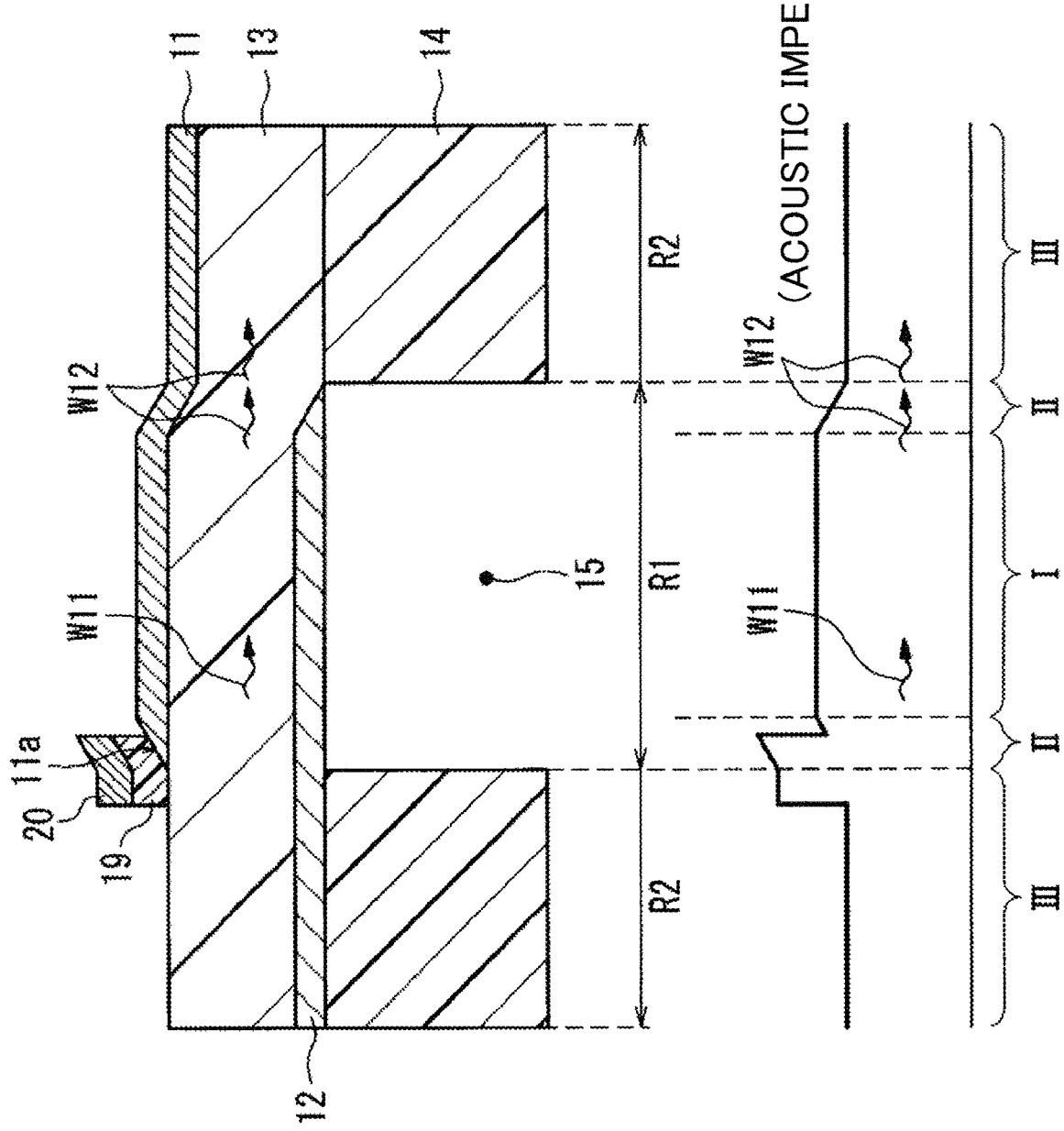
FIG. 9A is a cross-sectional view taken along line A-A in FIG. 8.
FIG. 9B is an acoustic impedance characteristic diagram.

FIG. 8 is a plan view of a piezoelectric thin-film resonator according to a third embodiment of the present invention. FIG. 9A is a cross-sectional view taken along line A-A in FIG. 8. FIG. 9B illustrates acoustic impedances in the piezoelectric thin-film resonator illustrated in FIGS. 8 and 9A. The third embodiment is characterized in that, of a region of a mass element, at least a portion that contacts an upper electrode 11 is made of a dielectric or a piezoelectric. In the configuration illustrated in FIG. 8, a piezoelectric 19 is provided between the mass element 20 and the upper electrode 11. With this configuration, the mass element 20 may be disposed at the possible outermost position inside the resonant portion R1 and therefore the reduction of the area of the resonant portion R1 that contributes to vibration by addition of the mass element 20 may be minimized and the decrease of the electromechanical coupling coefficient may be prevented. In this case, if a metal is deposited on the piezoelectric (or dielectric) 19, the same effect may be obtained with a smaller film thickness than in the case where only a dielectric, which has a lower mass, is added.

Figure 10:
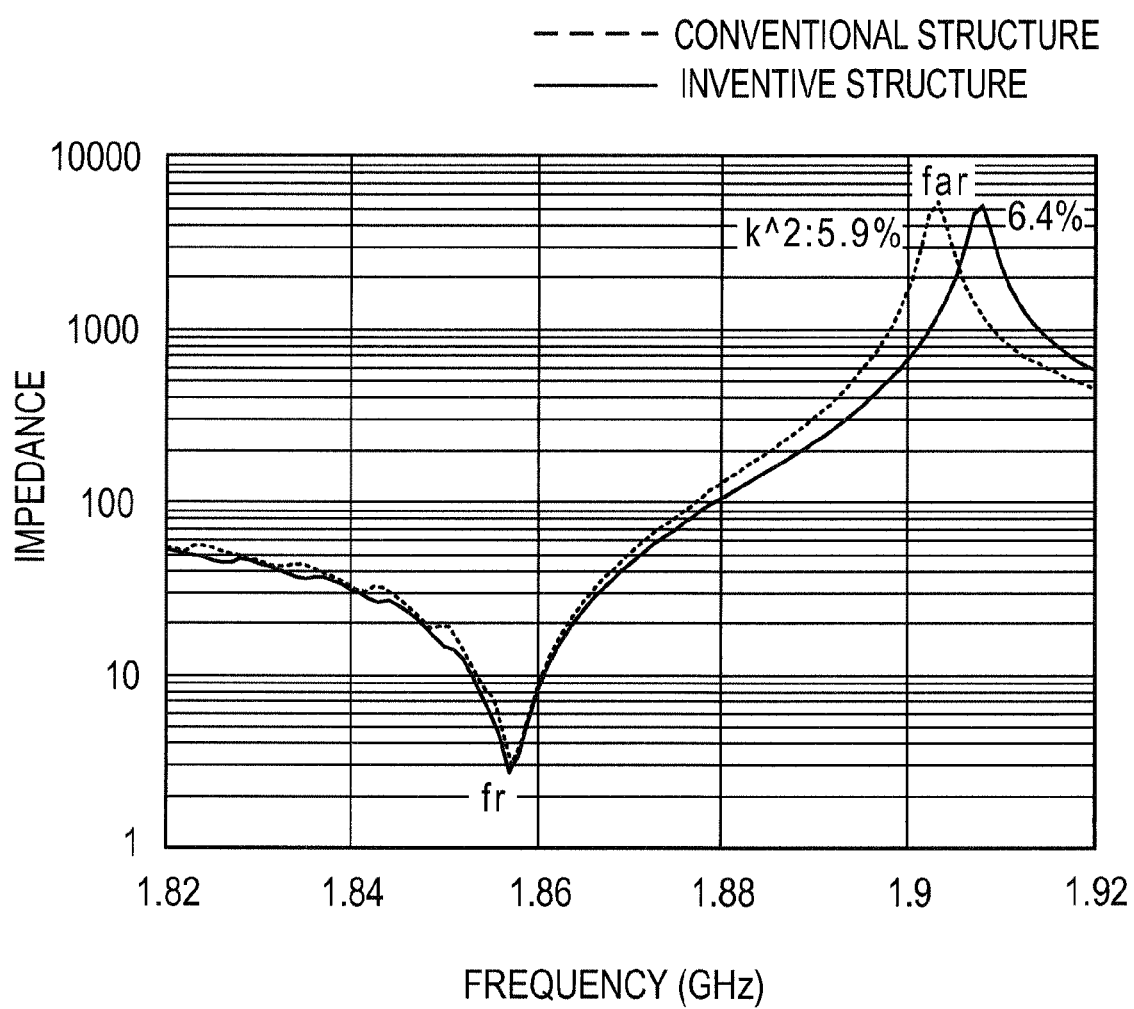
FIG. 10 is a characteristic diagram providing a comparison of electrical characteristics between the piezoelectric thin-film resonator according to the embodiment and a conventional piezoelectric thin-film resonator.

FIG. 10 illustrates electric characteristics of a piezoelectric thin-film resonator in which a mass element is added to the inner side of the resonant portion R1 (the conventional technique illustrated in FIGS. 28 and 29) and a piezoelectric thin-film resonator in which a mass element is added in such a manner that the mass element is in contact with the outer side of the resonant portion R1 (the third embodiment illustrated in FIGS. 8 and 9) calculated by using a piezoelectric FEM (finite element method) simulator. As illustrated from FIG. 10, the electromechanical coupling coefficients $k^\wedge$, which may be readily estimated from the difference between the resonance frequency and the antiresonance frequency, of the piezoelectric thin-film resonator of the present embodiment and the conventional piezoelectric thin-film resonator were confirmed to be 6.4% and 5.9%, respectively, showing a difference of 0.5% between them. At a frequency of 2 GHz, the difference in $k^\wedge 2$ is equivalent to about 4 MHz, which is a significant difference in communication apparatuses (such as mobile phones) that require wideband filters.

Examples of the piezoelectric thin-film resonators according to aspects of the present embodiments will be described below. The first to third examples are of the piezoelectric thin-film resonator according to the first embodiment, the fourth and fifth examples are of the piezoelectric thin-film resonator according to the second embodiment, and the sixth to eighth examples are of the piezoelectric thin-film resonator according to the third embodiment.

FIRST EXAMPLE

Figure 11A:
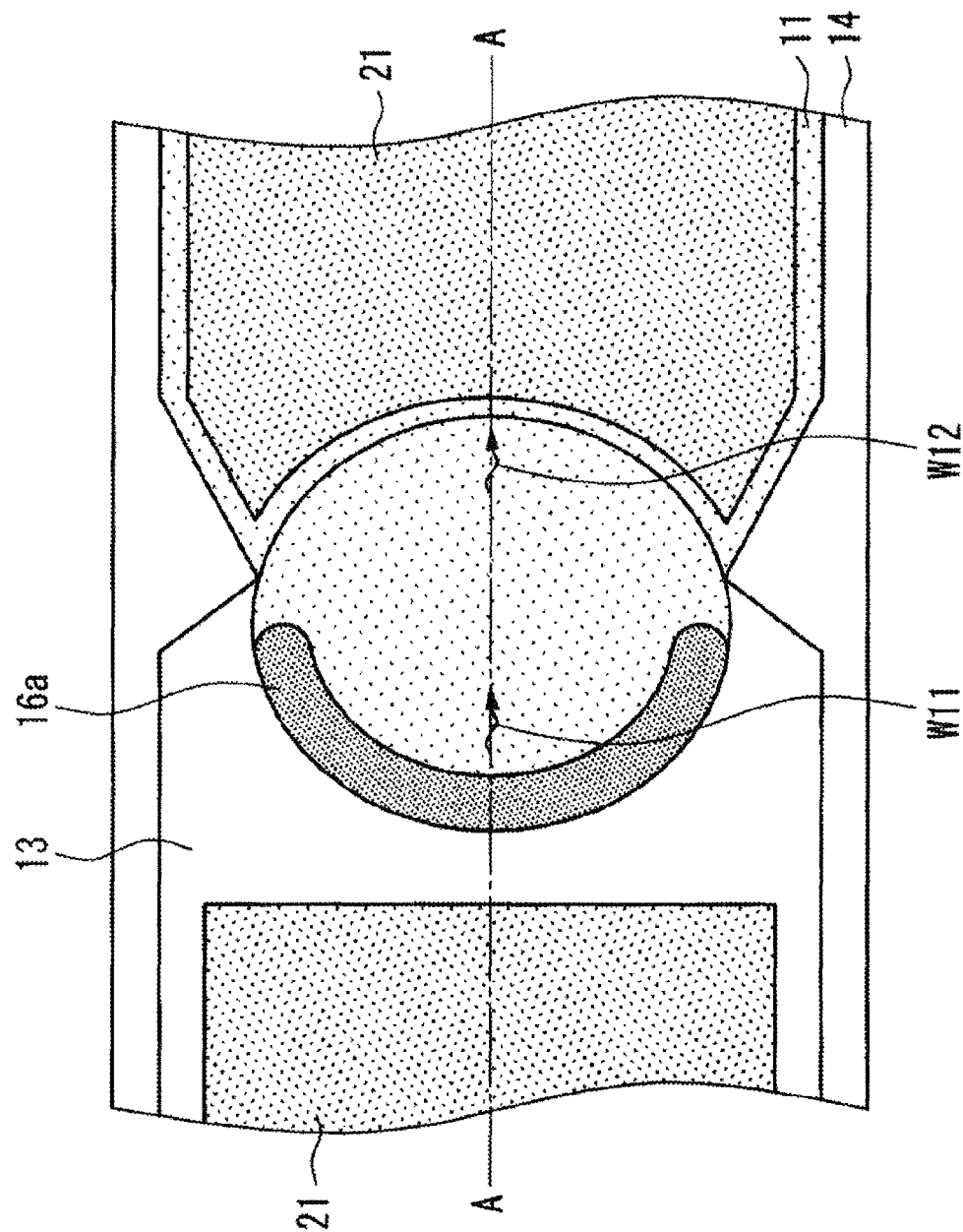
FIG. 11A is a plan view illustrating a relevant part of a piezoelectric thin-film resonator in a first example.

FIG. 11A is a plan view of a relevant part of the first example of the resonator according to the first embodiment. FIG. 11B is a cross-sectional view taken along line A-A in FIG. 11A. The piezoelectric thin-film resonator of the example includes a substrate 14, a piezoelectric film 13, an upper electrode 11 and a lower electrode 12 sandwiching the piezoelectric film 13, contact electrodes 21 which are low-resistant electrodes (of a material such as Au or Al) formed in a nonresonant portion R2 on the upper electrode 11, and a mass element 16a disposed on a sloped portion 11a of the upper electrode 11. The mass element 16a is formed so as to conform to an edge of the upper electrode 11 and is not formed on the entire edge, as illustrated in FIG. 11A.

The mass element 16a may be any of a piezoelectric, dielectric, and metal. The mass element 16a may be made of any one of aluminum nitride (AlN), lead zirconium titanate (PZT (Piezoelectric Zirconate Titanate)), silicon oxide ($SiO_2$), titanium oxide ($TiO_2$), ruthenium (Ru), molybdenum (Mo), gold (Au), titanium (Ti), copper (Cu), tungsten (W), and aluminum (Al), for example, or a composite material composed mostly of any one of these. The film thickness, width, and disposition of the mass element 16a may be determined by a simulation using the general-purpose piezoelectric analysis software described above, for example, and more preferably, they are determined from experiments. Sloped portions 11a and 11b of the upper electrode 11 and a sloped portion 12a of the lower electrode 12 may be formed by cutting with an ion-milling system. The mass element 16a may be formed by deposition by sputtering and then dry-etching or wet-etching.

With the configuration described above, elastic waves W11 generated in the resonant portion R1 are not confined in the resonant portion R1 but leak to the nonresonant portion R2 as leakedleaked waves W12 and therefore mutual strengthening of standing waves in the resonant portion R1 may be prevented.

SECOND EXAMPLE

Figure 12B:
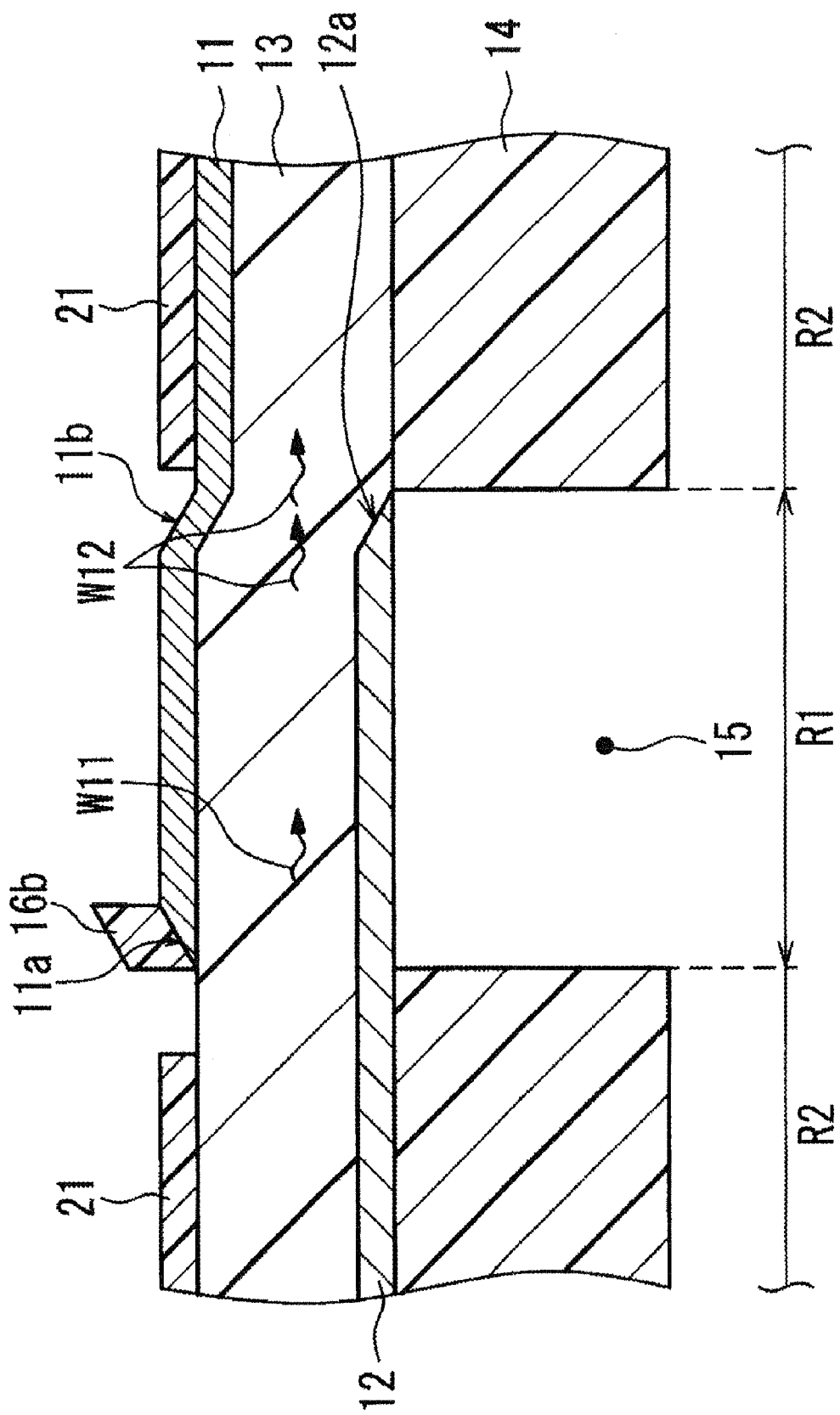
FIG. 12B is a cross-sectional view taken along line A-A in FIG. 12A.

FIG. 12A is a plan view of a relevant part of the second example of the resonator according to the first embodiment. FIG. 12B is a cross-sectional view taken along line A-A in the FIG. 12A. The configuration of the second example differs from that of the first example in the shape of the mass element. The second example is characterized by that the mass element 16b being formed not only at the edge of the upper electrode 11 but extending to the side opposed to the edge as illustrated in FIG. 12A. Furthermore, the mass element 16b does not surround the entire perimeter of the resonant portion R1 but an opening 16c is provided in a portion. Some of elastic waves W11 leak through the opening 16c to the nonresonant portion R2 as leakedleaked waves W12.

With the configuration described above, elastic waves W11 generated in the resonant portion R1 are not confined in the resonant portion R1 but leak to the nonresonant portion R2 as leaked waves W12 and therefore mutual strengthening of standing waves in the resonant portion R1 may be prevented.

THIRD EXAMPLE

FIG. 13A is a plan view of a relevant part of the third example of the resonator according to the first embodiment. FIG. 13B is a cross-sectional view taken along line A-A in FIG. 13A. The configuration of the third example differs from that of the first example in the shape of the mass element. The third example is characterized in that the mass element 16d is formed not only at the edge of the upper electrode 11 but extends to the side opposed to the edge as illustrated in FIG. 13A. Furthermore, the mass element 16d does not surround the entire perimeter of the resonant portion R1 but an opening 16e (which is the same as the opening 16c of the second example) and openings 16f are provided in portions of the perimeter. Some of elastic waves W11 leak through the openings 16e and 16f to the nonresonant portion R2 as leaked waves W12.

With the configuration described above, elastic waves W11 generated in the resonant portion R1 are not confined in the resonant portion R1 but leak to the nonresonant portion R2 as leaked waves W12 and therefore mutual strengthening of standing waves in the resonant portion R1 may be prevented.

FOURTH EXAMPLE

FIG. 14A is a plan view of a relevant part of the fourth example of the resonator according to the second embodiment. FIG. 14B is a cross-sectional view taken along line A-A in FIG. 14A. The piezoelectric thin-film resonator in the fourth example includes a substrate 14A, a piezoelectric film 13, an upper electrode 11 and a lower electrode 12 which sandwich the piezoelectric film 13, contact electrodes 21 which are low-resistant electrodes (of a material such as Au or Al) formed on a nonresonant portion R2 on the upper electrode 11, a first mass element 17a disposed on a sloped portion 11a of the upper electrode 11, and a second mass element 18a disposed on a sloped portion 11b of the upper electrode 11. The first mass element 17a is made of a piezoelectric, dielectric, or metal. The second mass element 18a is made of a material different from that of the first mass element 17a. The second mass element 18a is a piezoelectric, dielectric, or metal. The first and second mass elements 17a and 18a may be made of any one of aluminum nitride (AlN), lead zirconium titanate (PZT (Piezoelectric Zirconate Titanate)), silicon oxide ($SiO_2$), titanium oxide ($TiO_2$), ruthenium (Ru), molybdenum (Mo), gold (Au), titanium (Ti), copper (Cu), tungsten (W), and aluminum (Al), for example, or a composite material composed mostly of any one of these. The film thicknesses, widths, and dispositions of the first and second mass elements 17a and 18a may be determined by a simulation using the general-purpose piezoelectric analysis software described above, for example, and more preferably, they are determined from experiments. The sloped portion 11a of the upper electrode 11 and a sloped portion 12a of the lower electrode 12 may be formed by cutting with an ion-milling system. The first and second mass elements 17a and 18a may be formed by deposition by sputtering, then dry-etching or wet-etching.

The configuration described above makes it possible to suppress mutual strengthening of transverse standing waves, because the opposed sides of the perimeter of the resonant portion R1 have different acoustic impedances and therefore elastic waves W11 (reflected waves) reflected from the first mass element 17a and elastic waves W13 (reflected waves) reflected from the second mass element 18a are not in phase with each other.

FIFTH EXAMPLE

Figure 15A:
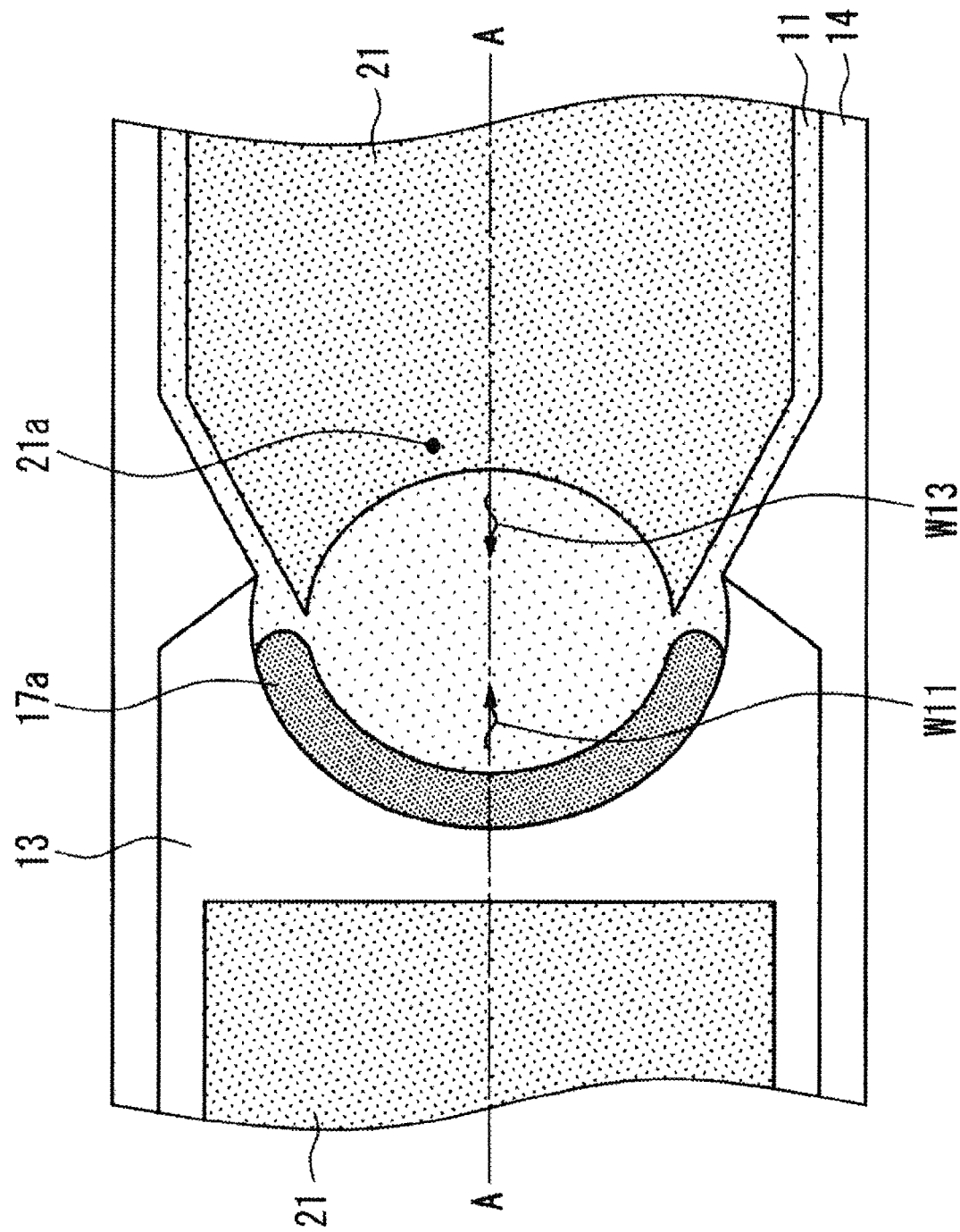
FIG. 15A is a plan view of a relevant part of a piezoelectric thin-film resonator in a fifth embodiment.

FIG. 15A is a plan view of a relevant part of the fifth example of a resonator according to the second embodiment. FIG. 15B is a cross-sectional view taken along line A-A in FIG. 15A. The configuration of the example differs from the configuration of the fourth example in that portions of contact electrodes 21 are extended onto a sloped portion 11b in stead of providing the second mass element 18a. The first mass element 17a is made of a material different from that of the contact electrodes 21, and may be made of any of the materials given in the description of the forth example.

In the fifth example, the edge 21a of one of the contact electrodes 21 is formed so as to be positioned on the sloped portion 11b. This makes it possible to suppress transverse standing waves strengthening one another, because the opposed sides of the perimeter of the resonant portion R1 have different acoustic impedances and therefore elastic waves W11 (reflected waves) reflected from the first mass element 17a and elastic waves W13 (reflected waves) reflected from the edge 21a of the contact electrode 21 are not in phase with each other.

Furthermore, according to the example, the number of fabrication steps may be reduced because the second mass element 18a in the fourth example is integrated with one of the contact electrodes 21.

While the second mass element 18a in the fourth example is integrated with one of the contact electrodes 21 in the fifth example, any one of the first and second mass elements 17a and 18a may be made of the same material as that of the contact electrodes 21 and integrated with one of the contact electrodes 21.

SIXTH EXAMPLE

Figure 16A:
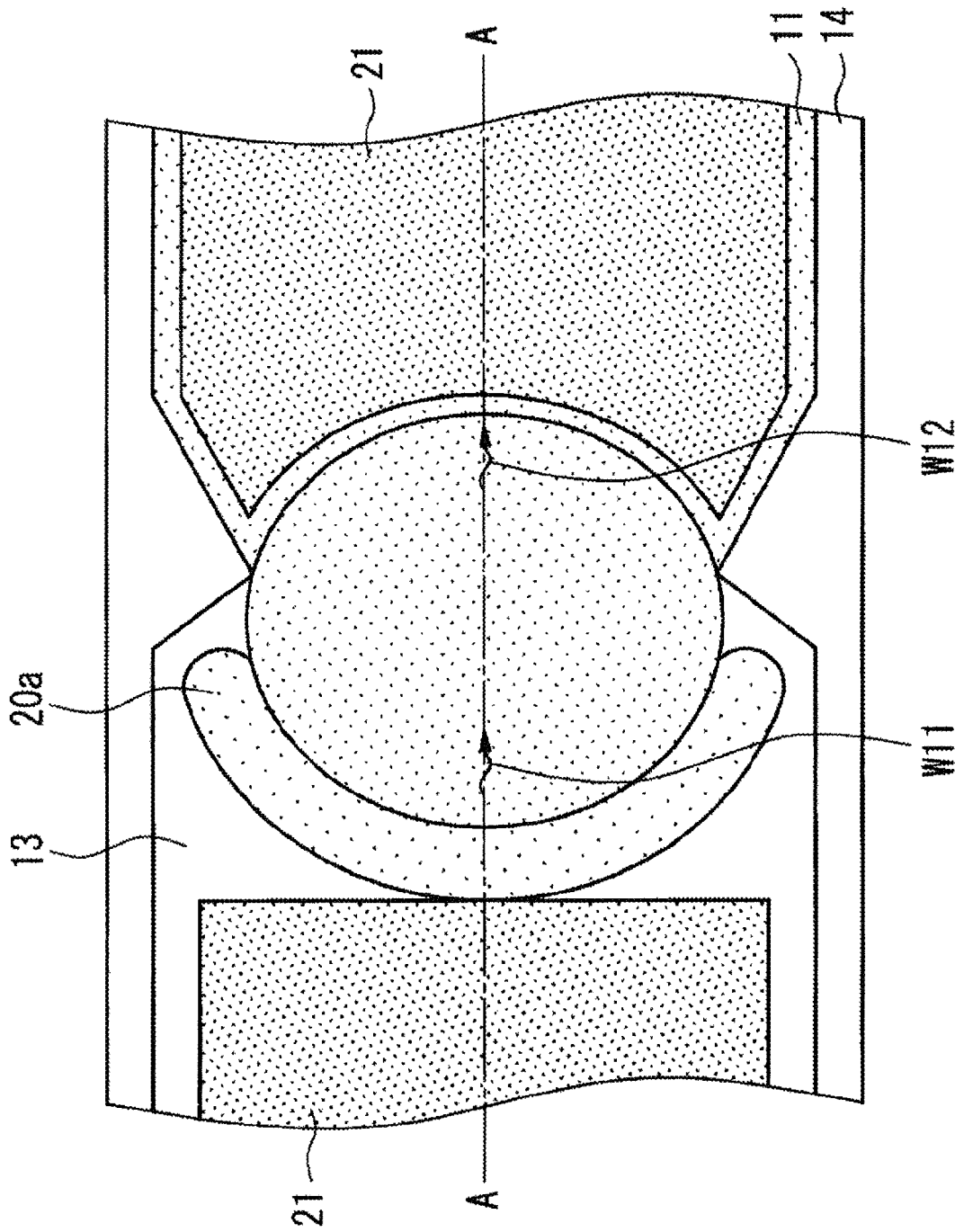
FIG. 16A is a plan view of a relevant part of a piezoelectric thin-film resonator in a sixth example.

FIG. 16A is a plan view of a relevant part of the sixth example of a resonator according to the third embodiment.

FIG. 16B is a cross-sectional view taken along line A-A in FIG. 16A. The piezoelectric thin-film resonator of the example includes a substrate 14, a piezoelectric film 13, an upper electrode 11 and a lower electrode 12 sandwiching the piezoelectric film 13, contact electrodes 21 which are low-resistant electrodes (of a material such as Au or Al) formed on a nonresonant portion R2 of the upper electrode 11, a third mass element 19a, and a fourth mass element 20a. The third mass element 19a is preferably disposed from a position on a sloped portion 11a of the upper electrode 11 near the nonresonant portion R2 to a position in the nonresonant portion R2. In the example, the third mass element 19a is disposed from a position on the sloped portion 11a to a position in contact with the piezoelectric film 13 in the vicinity of the edge of the upper electrode 11. The third mass element 19a is preferably made of a piezoelectric or a dielectric. The fourth mass element 20a is stacked on the third mass element 19a. The third and fourth mass elements 19a and 20a may be made any of aluminum nitride (AlN), lead zirconium titanate (PZT (Piezoelectric Zirconate Titanate)), silicon oxide ($SiO_2$), titanium oxide ($TiO_2$), ruthenium (Ru), molybdenum (Mo), gold (Au), titanium (Ti), copper (Cu), tungsten (W), and aluminum (Al), for example. The film thicknesses, widths, and dispositions of the third and fourth mass elements 19a and 20a may be determined by a simulation using the general-purpose piezoelectric analysis software described above, for example, and more preferably, they are determined from experiments. The sloped portion 11a of the upper electrode 11 and the sloped portion 12a of the lower electrode 12 may be formed by cutting with an ion-milling system. The third and fourth mass elements 19a and 20a may be formed by deposition by sputtering, then dry-etching or wet-etching.

With the configuration described above, the third and fourth mass elements 19a and 20a may be disposed at the possible outermost position inside the resonant portion R1, and therefore a reduction of the area of the resonant portion R1 contributing to vibration by addition of the mass elements may be minimized and a reduction of the electromechanical coupling coefficient may be prevented. If a metal is deposited on the third mass element 19a, the same effect may be provided with a smaller film thickness than in the case where only a low-mass dielectric is added.

SEVENTH EXAMPLE

FIG. 17A is a plan view of a relevant part of the seventh example of a resonator according to the third embodiment. FIG. 17B is a cross-sectional view taken along line A-A in FIG. 17A. The configuration of the seventh example differs from the configuration of the sixth example in that a second mass element 18a (see the fourth example) is disposed on a sloped portion 11b formed on the side of the upper electrode 11 opposed to the sloped portion 11a. The rest of the configuration is the same as the configuration of the sixth example. The details of the configuration of the second mass element 18a have been described in the fourth example and therefore the description thereof will be omitted. The mass of the second mass element 18a is at least different from the total of the masses of the third and fourth mass elements 19a and 20a.

With the configuration described above, the third and fourth mass elements 19a and 20a may be disposed at the possible outermost position inside the resonant portion R1, and therefore a reduction of the area of the resonant portion R1 contributing to vibration by addition of the mass elements may be minimized and a reduction of the electromechanical coupling coefficient may be prevented. If a metal is deposited on the third mass element 19a, the same effect may be provided with a smaller film thickness than in the case where only a low-mass dielectric is added.

In addition, the configuration makes it possible to suppress transverse standing waves strengthening one another, because the opposed sides of the perimeter of the resonant portion R1 have different acoustic impedances and therefore elastic waves W11 (reflected waves) reflected from the third and fourth mass elements 19a and 20a and elastic waves W13 (reflected waves) reflected from the second mass element 18a are not in phase with each other.

EIGHTH EXAMPLE

FIG. 18A is a plan view of a relevant part of the eight example of a resonator of according to the third embodiment. FIG. 18b is a cross-sectional view take along line A-A in FIG. 18A. The configuration of the eighth example differs from the configuration of the seventh example in that a portion of one of the contact electrodes 21 is extended onto a sloped portion 11b in stead of providing the second mass element 18a. The first mass element 17a is made of a material different from that of the contact electrodes 21 and may be any of the materials given in the description of the fourth example.

In the eighth example, the edge 21a of one of the contact electrodes 21 is formed so as to be positioned on the sloped portion 11b. This makes it possible to suppress transverse standing waves strengthening one another, because the opposed sides of the perimeter of the resonant portion R1 have different acoustic impedances and therefore elastic waves W11 (reflected waves) reflected from the first mass element 17a and elastic waves W13 (reflected waves) reflected from the edge 21a of the contact electrode 21 are not in phase with each other.

Furthermore, according to the example, the number of fabrication steps may be reduced because the second mass element 18a is integrated with one of the contact electrodes 21.

While the second mass element 18a in the example is integrated with one of the contact electrodes 21 shown in the seventh example, any one of the first and second mass elements 17a and 18a may be made of the same material as that of the contact electrodes 21 and integrated with one of the contact electrodes 21.

The upper and lower electrodes 11 and 12 of the piezoelectric thin-film resonators in the first to eight examples may be made of a material such as aluminum (Al), copper (Cu), molybdenum (Mo), tungsten (W), tantalum (Ta), platinum (Pt), ruthenium (Ru), rhodium (Rh), or iridium (Ir). The piezoelectric film 13 may be made of a material such as aluminum nitride (AlN), lead zirconium titanate (PZT (Piezoelectric Zirconate Titanate)), or lead titanate ($PbTiO_3$). The substrate 14 may be made of a material such as a silicon or glass. The piezoelectric film 13 preferably contains aluminum nitride (AlN). Since sound travels fast in AlN, a resonator having a high Q value may be implemented. At least one of the lower electrode 12 and the upper electrode 11 preferably includes a ruthenium (Ru) film. Since Ru has high acoustic impedance, a resonator having a high Q value may be implemented.

While the lower electrode 12 of the piezoelectric thin-film resonator in the present embodiments is formed over the cavity 15 in substrate 14 so as to pass through the substrate 14, the cavity 15 may be formed on the surface of the substrate 14 and the lower electrode 12 may be provided over the cavity.

The piezoelectric thin-film resonator in the present embodiments is not limited to an FBAR piezoelectric thin-film resonator. It may be an SMR (solidly mounted resonator) piezoelectric thin-film resonator.

The drawings referred to in the description of the examples show only the main part of the resonators. Other components may be provided. For example, a dielectric film may be provided under the lower electrode 12 as a reinforcing or an etching stop layer, or a passivation film or a dielectric film for frequency adjustment may be provided on the upper electrode 11.

[2. Method for Fabricating Piezoelectric Thin-film Resonator]

Figure 19A:
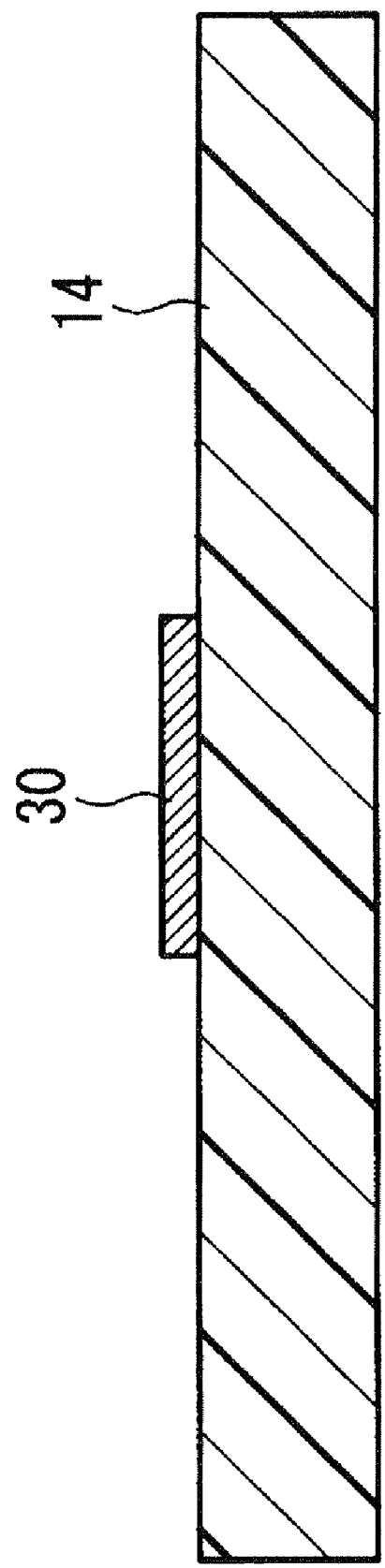
FIG. 19A is a cross-sectional view illustrating a fabrication process of a piezoelectric thin-film resonator according to an embodiment.

FIGS. 19A to 19C are diagrams illustrating a process of fabricating a piezoelectric thin-film resonator. The exemplary piezoelectric thin-film resonator shown has a configuration in which a cavity is formed between the surface of a substrate 14 and a lower electrode 12 in the piezoelectric thin-film resonator of the forth example.

First, a sacrifice layer film 30 is formed on an Si (or quartz) substrate 14 as illustrated in FIG. 19A. The sacrifice layer film 30 is formed by sputtering or vacuum vapor deposition of magnesium oxide (MgO). The thickness of the substrate 14 was approximately 20 to 100 nm, for example. The material of the sacrifice layer 30 is not limited to MgO. The sacrifice layer 30 may be made of any other material, such as zinc oxide (ZnO), germanium (Ge), titanium (Ti), or silicon oxide ($SiO_2$), that may be readily melted by an etchant.

Then, the sacrifice layer 30 is patterned to a desired shape by photolithography and etching. Here, the sacrifice layer 30 was patterned into the shape of an ellipse that is approximately the same as the shape of the portion in which the upper electrode 11 and the lower electrode 12 overlap one another.

Then, a lower electrode 12, a piezoelectric film 13, an upper electrode 11, and a weighting layer are formed in sequence on the substrate 14 and the sacrifice layer 30 as illustrated in FIG. 19B. The lower electrode 12 is formed by sputtering and then is patterned into a desired shape by photolithography and etching. Then, an AlN film, which is the piezoelectric film 13, is formed by sputtering by using an Al target in an Ar—N2 gas mixture. The Ru film of the upper electrode 11 is foamed by sputtering. The weighting layer, which may be Ti, for example, is formed by sputtering. Photolithography and etching (wet or dry etching) are applied to the multilayered film thus formed to pattern the weighting layer, the upper electrode 11, and the piezoelectric film 13 into a desired shape. Sputtering conditions are set so that the stress of the multilayered film consisting of the lower electrode 12, the piezoelectric film 13, and the upper electrode 11 becomes compressive stress. The center portion of the lead region of the upper electrode 11 that contacts a membrane is formed above a cavity, which will be formed at the next step, and both edges of the lead region of the upper electrode 11 are formed above a region outside the cavity.

Then, as illustrated in FIG. 19C, a hole through which an etchant is to be introduced is formed in the lower electrode 12 by photolithography using resist patterning and the etchant is introduced through the hole to remove the sacrifice layer 30 by etching to form the cavity 31. The hole for introducing the etchant may be formed at the same time the lower electrode 12 is etched. Here, conditions are set so that the stress of the multilayered film consisting of the lower electrode 12, the piezoelectric film 13, and the upper electrode 11 becomes compressive stress. Under such stress conditions, the multilayered film bulges and, as a result, a domed cavity 31 may be formed between the lower electrode 12 and the substrate 14.

[3. Duplexer]

Mobile communication (high-frequency radio communication) devices such as mobile phones, cell-phones, and wireless LAN systems include a duplexer. Duplexers are used in radio devices that have transmitter and receiver functions and use a transmission signal and a received signal with different frequencies.

Figure 20:
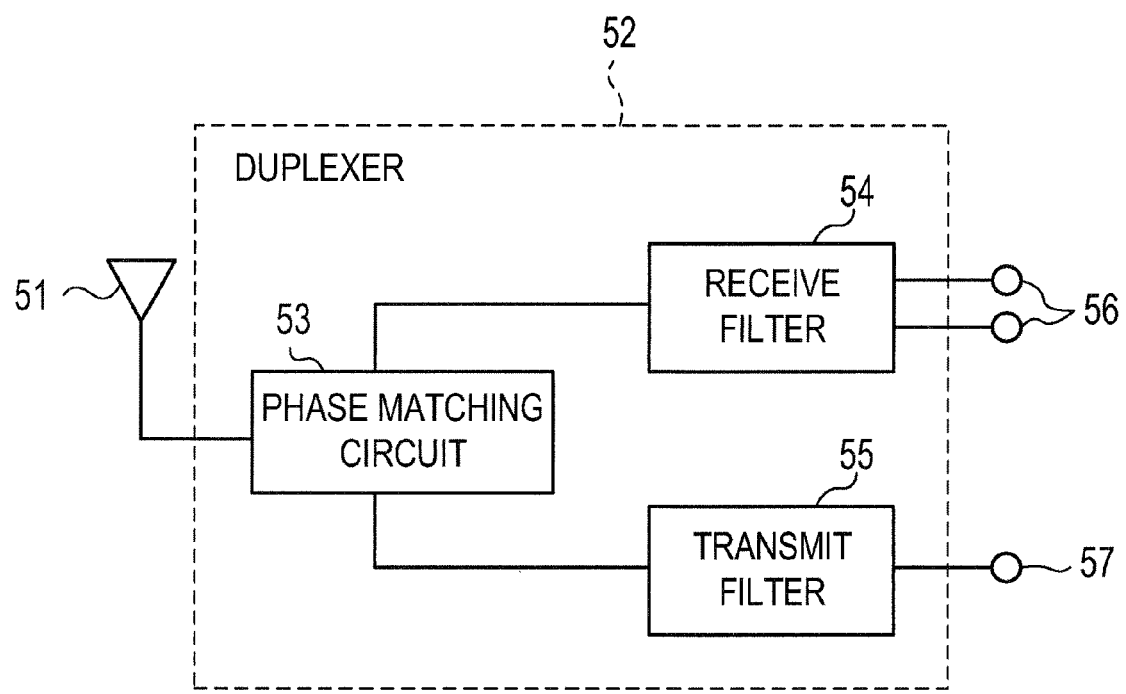
FIG. 20 is a block diagram illustrating a duplexer according to an embodiment.

FIG. 20 illustrates a duplexer including piezoelectric thin-film resonators according to one of the present embodiments. The duplexer 52 includes a phase matching circuit 53, a receive filter 54, and a transmit filter 55. The phase matching circuit 53 is an element for adjusting the phase of impedance of the receive filter 54 to prevent a transmission signal output from the transmit filter 55 from flowing into the receive filter 54. An antenna 51 is connected to the phase matching circuit 53. The receive filter 54 is a band-pass filter that passes only signals that are in a given frequency band among received signals input through the antenna 51. An output terminal 56 is connected to the receive filter 54. The transmit filter 55 is a band-pass filter that passes only signals that are in a given frequency band among transmission signals input through an input terminal 57 connected to the transmit filter 55. Here, each of the receive filter 54 and the transmit filter 55 includes a piezoelectric thin-film resonator according to the embodiment.

By providing the piezoelectric thin-film resonator of any of the present embodiments in each of the receive filter 54 and the transmit filter 55 as described above, spike-like loss (spurious) in the passing bands may be prevented and insertion loss and EVM (Error Vector Magnitude) may be reduced.

[4. Communication Module]

Figure 21:
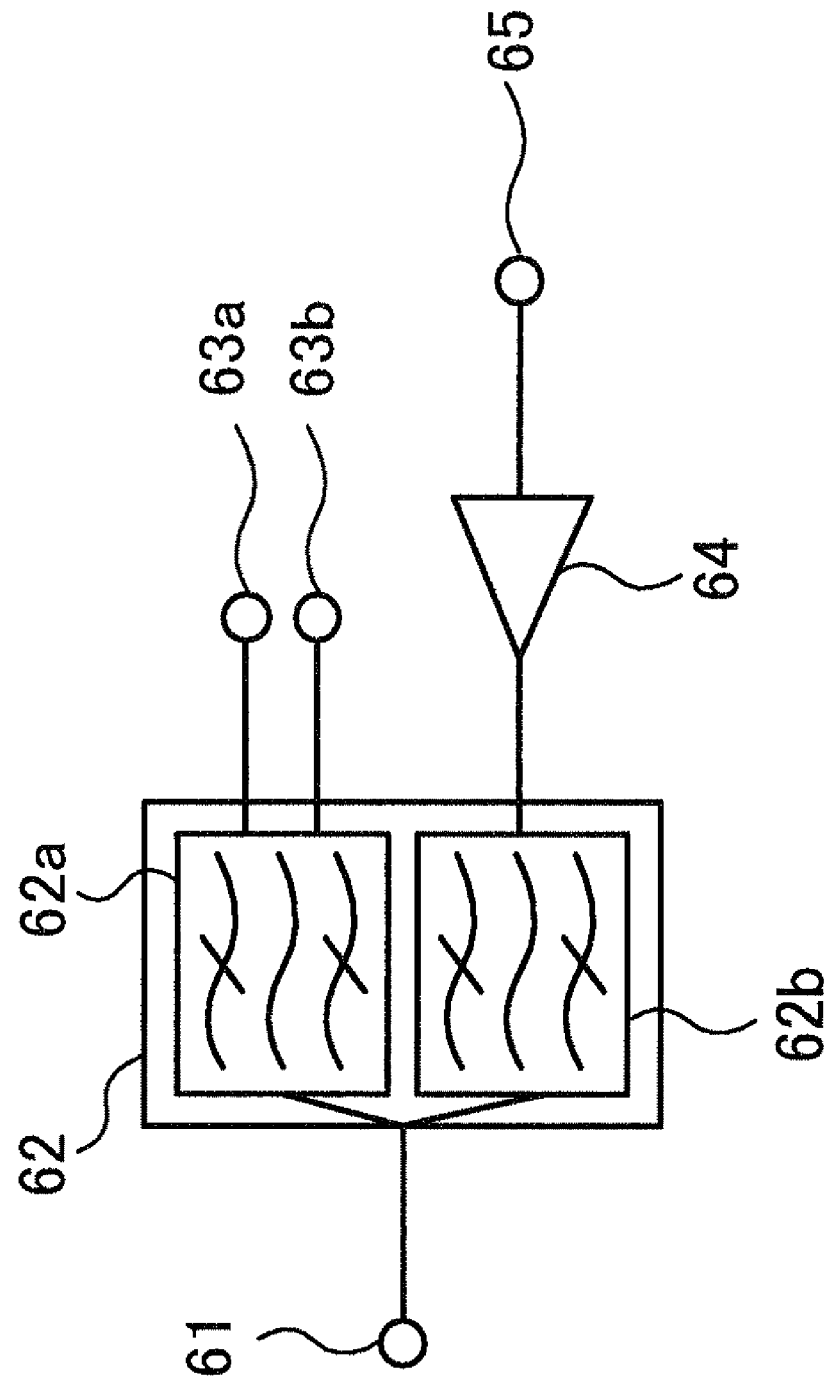
FIG. 21 is a block diagram illustrating a communication module according to an embodiment.

FIG. 21 illustrates an exemplary communication module including piezoelectric thin-film resonators according to any of the present embodiments or the duplexer described above. As illustrated in FIG. 21, the duplexer 62 includes a receive filter 62a and a transmit filter 62b. Connected to the receive filter 62a are receiving terminals 63a and 63b which support balanced output, for example. The transmit filter 62b is connected to a transmitting terminal 65 through a power amplifier 64. Here, each of the receive filter 62a and the transmit filter 62b includes a piezoelectric thin-film resonator according to the present embodiment.

In receiving operation, the receive filter 62a passes only signals that are in a given frequency band among received signals input through an antenna terminal 61 and outputs the signals to the outside through the receiving terminals 63a and 63b. In transmitting operation, the transmit filter 62b passes only signals that are in a given frequency band among transmission signals input through the transmitting terminal 65 and amplified by the power amplifier 64 and outputs the signals to the outside through the antenna terminal 61.

By providing a piezoelectric thin-film resonator according to any of the present embodiments or a duplexer in the receive filter 62a and the transmit filter 62b of the communication module as described above, spike-like loss (spurious) in the passing bands may be prevented and insertion loss and EVM (Error Vector Magnitude) may be reduced.

The communication module illustrated in FIG. 21 is illustrative only and the same effects may be obtained by providing piezoelectric thin-film resonators of any of the present examples in a communication module of other type.

[5. Communication Apparatus]

Figure 22:
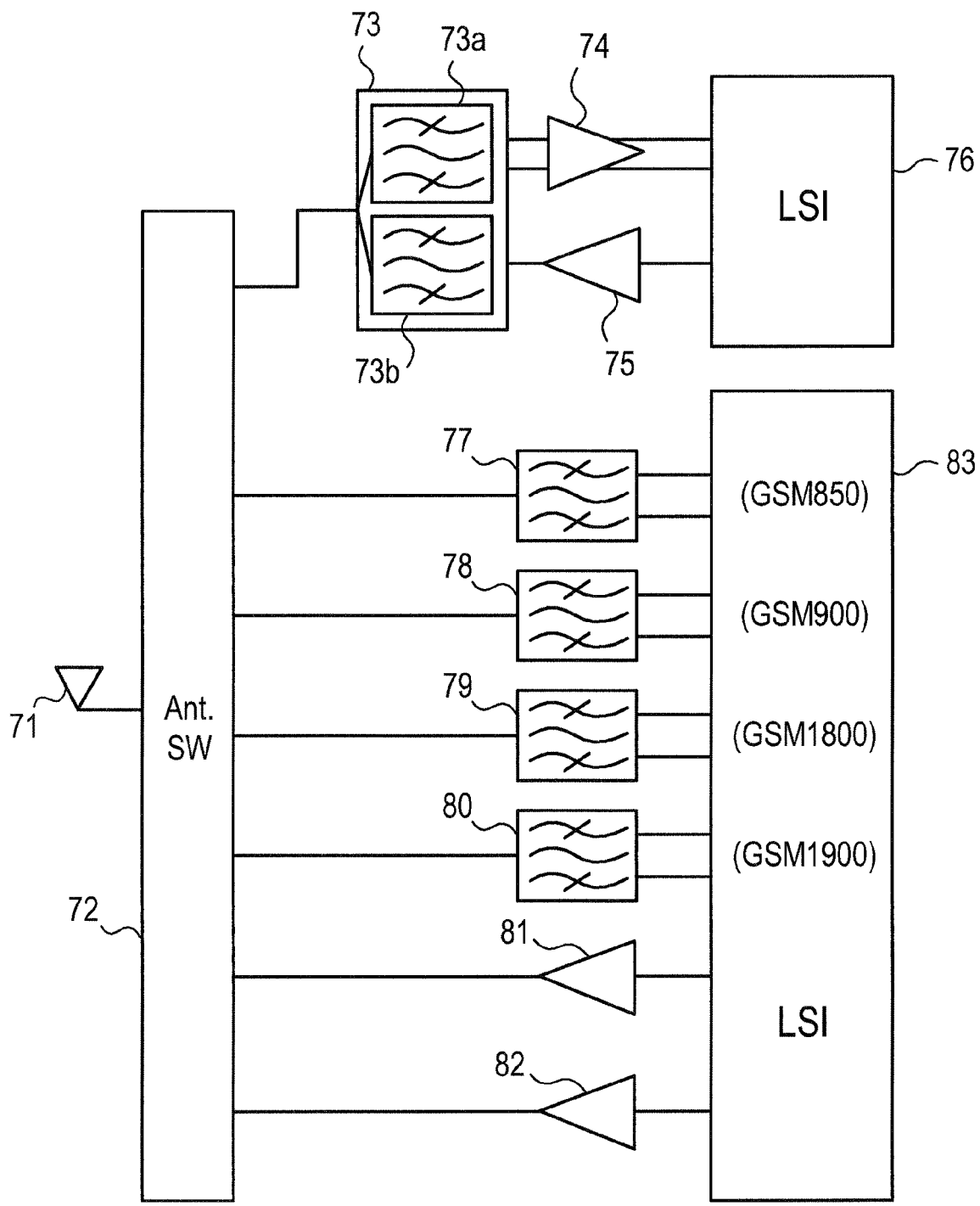
FIG. 22 is a block diagram illustrating a communication apparatus according to an embodiment.

FIG. 22 illustrates an RF block of a mobile phone, which is an example of a communication apparatus including piezoelectric thin-film resonators according to any of the present embodiments. The configuration illustrated in FIG. 22 is of a mobile phone that supports GSM (Global System for Mobile Communications) and W-CDMA (Wideband Code Division Multiple Access) communication standards. The GSM communication standard in the embodiment supports frequency bands of 850 MHz, 950 MHz, 1.8 GHz, and 1.9 GHz. While the mobile phone includes a microphone, a speaker, and a liquid-crystal display, and other components in addition to those illustrated in FIG. 22, they are not essential to description of the embodiment and therefore are omitted from FIG. 22. Here, each of receive filters 73a, 77, 78, 79, and 80 and a transmit filter 73b includes a piezoelectric thin-film resonator according to the embodiment.

An antenna switch circuit 72 selects an LSI to be operated according to whether a received signal input through an antenna 71 conforms to W-CDMA or GSM. If an input received signal conforms to W-CDMA, the antenna switch circuit 72 makes switching to cause the received signal to be output to a duplexer 73. The received signal input in the duplexer 73 is limited by the receive filter 73a to a given frequency band and a balanced-type received signal is output to a low noise amplifier (LNA) 74. The LNA 74 amplifies the input received signal and outputs the amplified signal to an LSI 76. The LSI 76 performs demodulation to a sound signal and controls operation of components in the mobile phone based on the input received signal.

On the other hand, when a signal is to be sent out, the LSI 76 generates the transmission signal. The generated transmission signal is amplified by a power amplifier 75 and is input in the transmit filter 73b. The transmit filter 73b passes only the signals that are in a given frequency band among input transmission signals. The transmission signal output from the transmit filter 73b is output to the outside through the antenna switch circuit 72 and the antenna 71.

If a received signal conforms to GSM, the antenna switch circuit 72 selects one of the receive filters 77 to 80 in accordance with the frequency band and outputs the received signal to the receive filter. The received signal limited by one of the receive filters 77 to 80 to a band is input in an LSI 83. The LSI 83 performs demodulation to a sound signal and controls operation of components of the mobile phone based on the input received signal. On the other hand, when a signal is to be sent out, the LSI 83 generates the transmission signal. The generated transmission signal is amplified by a power amplifier 81 or 82 and is output to the outside through the antenna switch circuit 72 and the antenna 71.

By providing piezoelectric thin-film resonators according to any of the present embodiments or a communication module including the piezoelectric thin-film resonators in the communication apparatus as described above, spike-like loss (spurious) in passing bands may be prevented and insertion loss and EVM (Error Vector Magnitude) may be reduced.

[6. Advantages of the Embodiments]

According to the present embodiments, since at and beyond the boundary between the region defined by the opposed upper and lower electrodes, a mass element 16 is added onto the upper electrode 11 in such a manner that the acoustic impedance of a portion of the boundary is greater than the acoustic impedance of the inner region, transverse-mode waves may be confined in the piezoelectric film 13. In addition, since the mass element 16 is not added to the entire boundary, an increase of the intensity of transverse-mode standing waves may be prevented by properly choosing the location to which the mass element is not added. Therefore, energy dissipation of transverse waves may be prevented while minimizing a reduction in the electromechanical coupling coefficient and a reduction of the bandwidth as compared with the conventional configurations. Furthermore, an increase of the intensity of standing wave mode may be suppressed and large spike-like loss points (spurious) may be prevented from appearing on the low-frequency side from the resonance point.

By providing the configuration in which, at the boundary between the region defined by the opposed upper and lower electrodes and the region outside the region, the acoustic impedance of a portion of the boundary that coincides with the edge of the upper electrode 11 differs from the acoustic impedance of a portion of the boundary that does not coincide with the edge of the upper electrode 11, transverse-mode waves may be confined in the piezoelectric film 13. In addition, since transverse-modes waves reflected from these portions of the boundary with the different acoustic impedances are not in phase with each other, increase of the intensity of transverse-mode standing waves may be prevented.

By providing the configuration in which at least a portion of the mass element includes a dielectric or piezoelectric that is in contact with the upper electrode 11, the mass element added may be positioned as close to the boundary as possible. Therefore, a reduction of the area of the resonant portion R1 that contributes to vibration by addition of the mass element may be minimized and accordingly a reduction of the electromechanical coupling coefficient $k^\wedge$ may be prevented.

The provision of sloped portions 11a and 11b with an angle of inclination of less than 90 degrees in the upper electrode 11 at the boundary between the region where the upper and lower electrodes are opposed to each other and the outside region may prevent geometric discontinuity and trouble in manufacturing which would otherwise be caused by steps when the mass element is disposed. Thus, a high-quality resonator may be fabricated.

Since the mass element, which is added so as to increase the acoustic impedance at the boundary that does not coincide with the edge of the upper electrode 11, may be formed from a low-resistance electrode containing Ti and Au, transverse waves may be confined in the resonant portion R1 and the series resistance of the resonator may be reduced. Thus, a resonator with a high Q factor may be fabricated.

By choosing the shape of the region defined by the upper and lower electrodes opposed to each other to be elliptical, reflected waves in a particular direction do not strengthen one another and therefore increase of the intensity of transverse-mode standing waves may be further suppressed even if transverse waves are reflected at the boundary between the resonant portion R1 and the nonresonant portion R2.

By choosing the shape of the region defined by the upper and lower electrodes opposed each other to be a non-rectangular polygonal, reflected waves in a particular direction do not strengthen one another and therefore increase of the intensity of transverse-mode standing waves may be further suppressed even if transverse waves are reflected at the boundary between the resonant portion R1 and the nonresonant portion R2.

By using dry etching, sloped portions 11a and 11b may be formed with a high degree of precision.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments in accordance with aspects of the present invention have been described in detail, it should be understood that the various changes, substitutions, and alterations could be made hereto without departing from the spirit and scope of the invention.

The invention claimed is:

1. A piezoelectric thin-film resonator comprising:
a substrate;
a lower electrode disposed on the substrate;
a piezoelectric film disposed on the lower electrode;
an upper electrode disposed on the piezoelectric film wherein a portion of the upper electrode forms a first region such that the upper electrode is opposed to the lower electrode; and
a mass element disposed on the upper electrode,
wherein the upper electrode has a first sloped portion having an angle of less than 90° at a boundary between a region opposed to the lower electrode and a region on an outer side of the region opposed to the lower electrode, and
the mass element is disposed on the first sloped portion.

2. The piezoelectric thin-film resonator according to claim 1,
wherein a boundary surrounds the first region, and
wherein the mass element is disposed in a position where an apparent acoustic impedance of a portion of the piezoelectric film at the boundary and at a second region outside the first region is greater than an apparent acoustic impedance of the piezoelectric film on the inside of the boundary.

3. The piezoelectric thin-film resonator according to claim 1,
wherein the lower electrode has a second sloped portion having an angle of less than 90° at a boundary between a region opposed to the upper electrode and a region on an outer side of the region opposed to the upper electrode,
the mass element has a first mass element disposed on the first sloped portion and a second mass element disposed in a region overlapping the second sloped portion on the upper electrode, and
the first mass element and the second mass element have different masses and are disposed so that an apparent acoustic impedance of the piezoelectric film under the first mass element is different from an acoustic impedance of the piezoelectric film under the second mass element.

4. The piezoelectric thin-film resonator according to claim 1, wherein at least a portion of the mass element includes a dielectric or a piezoelectric and the dielectric or the piezoelectric is in contact with the upper electrode.

5. The piezoelectric thin-film resonator according to claim 1, wherein the mass element includes titanium (Ti) and gold (Au).

6. The piezoelectric thin-film resonator according to claim 1, wherein the first region is elliptical in shape as viewed in the direction normal to the principal plane of the upper electrode.

7. The piezoelectric thin-film resonator according to claim 1, wherein the first region is non-rectangular polygonal in shape as viewed in the direction normal to the principal plane of the upper electrode.

8. The piezoelectric thin-film resonator according to claim 7, wherein the sloped portion is formed by dry etching.

9. The piezoelectric thin-film resonator according to claim 1, wherein the piezoelectric film is made of aluminum nitride (AlN).

10. The piezoelectric thin-film resonator according to claim 4, wherein the dielectric is made of silicon oxide ($SiO_2$).

11. The piezoelectric thin-film resonator according to claim 1, wherein at least a portion of the upper electrode and a portion of the lower electrode are made of ruthenium, the portions being in contact with the piezoelectric film.

12. A filter comprising the piezoelectric thin-film resonator according to claim 1.

13. A duplexer comprising the filter according to claim 12.

14. A communication module comprising the filter according to claim 12.

15. A communication apparatus comprising the communication module according to claim 14.

* * * * *